United States Patent [19]

Hamamoto et al.

[11] Patent Number: 5,548,145
[45] Date of Patent: Aug. 20, 1996

[54] SEMICONDUCTOR MEMORY APPARATUS

[75] Inventors: Takeshi Hamamoto, Kanagawa-ken; Takashi Yamada, Ebina; Yutaka Ishibashi, Kawasaki, all of Japan

[73] Assignee: Kabushiki Kaisha Toshiba, Kawasaki, Japan

[21] Appl. No.: 328,526

[22] Filed: Oct. 25, 1994

[30] Foreign Application Priority Data

Oct. 25, 1993 [JP] Japan .................................. 5-266089
Jun. 28, 1994 [JP] Japan .................................. 6-146650
Oct. 20, 1994 [JP] Japan .................................. 6-255125

[51] Int. Cl.$^6$ ................................................ H01L 27/108
[52] U.S. Cl. ......................... 257/301; 257/390; 257/305; 257/630
[58] Field of Search ................................. 257/301, 390, 257/305, 630; 365/149

[56] References Cited

U.S. PATENT DOCUMENTS

| | | | |
|---|---|---|---|
| 4,785,337 | 11/1988 | Kenney | 257/304 |
| 5,057,887 | 10/1991 | Yashiro et al. | 257/305 |
| 5,245,205 | 9/1993 | Higasitani et al. | 257/296 |

FOREIGN PATENT DOCUMENTS

| | | |
|---|---|---|
| 3-36762 | 2/1991 | Japan . |
| 3-69092 | 3/1991 | Japan . |
| 4-3463 | 1/1992 | Japan . |
| 4-147490 | 5/1992 | Japan . |

OTHER PUBLICATIONS

Takeshi Hamamoto, et al., "NAND–Structured Cell Technologies For Low Cost 256Mb DRAMs", 1993 IEEE IEDM Technical Digest, 1993, pp. 643–646.

Don Stark, et al., "An Experimental Cascade Cell Dynamic Memory", 1994 Symposium on VLSI Circuits Digest of Technical Papers, 1994, pp. 89–90.

Katsutaka Kimura, et al., "A Block–Oriented RAM with Half–Sized DRAM Cell and Quasi–Folded Data–Line Architecture", 1991 IEEE International Solid–State Circuits Conference Digest of Technical Papers, 1991, pp. 106–107.

Takehiro Hasegawa, et al., "WP 3.3: An Experimental DRAM with a NAND–Structured Cell", 1993 IEEE International Solid–state Circuits Conference Digest of Technical Papers, 1993, pp. 46–47.

Shinichiro Shiratake, et al., "A Staggered NAND DRAM Array Architecture for a Gbit Scale Integration", 1994 Symposium on VLSI Circuits Digest of Technical Papers, 1994, pp. 75–76.

*Primary Examiner*—Robert P. Limanek
*Attorney, Agent, or Firm*—Oblon, Spivak, McClelland, Maier & Neustadt, P.C.

[57] ABSTRACT

A semiconductor memory device comprises a semiconductor substrate having memory cell area, a plurality of trenches selectively formed in the memory cell area aligning in certain intervals and a plurality of memory cell arrays provided in the memory cell area, wherein each of the memory cell arrays comprises a plurality of MOS transistors connected in a serial array and a plurality of capacitors each formed in a corresponding one of the trenches. Each of the transistors has a gate electrode above the substrate with a gate insulating film formed therebetween and source and drain regions formed in the substrate on both sides of the gate electrode. Each of the capacitors includes a charge storage layer formed on an inner wall of each of the trenches and connected integrally to one of the source and drain regions of each of the transistors, a capacitor insulating film formed on the charge storage layer and a capacitor electrode formed on the capacitor insulating film so as to bury each of the trenches and extending to the surface of the substrate, which is formed on the surface of the substrate except for at least formation areas of the transistors.

7 Claims, 30 Drawing Sheets

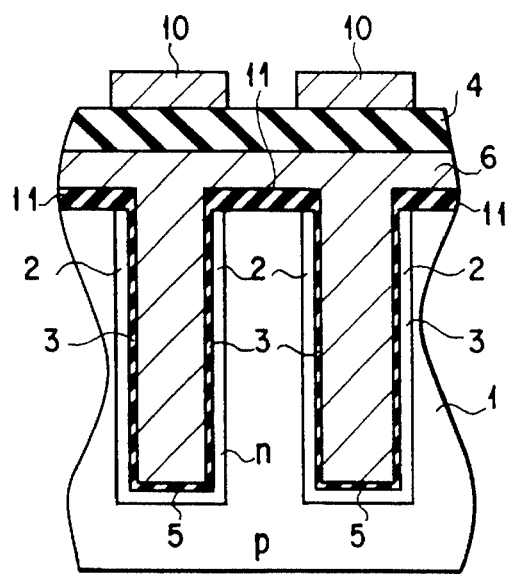
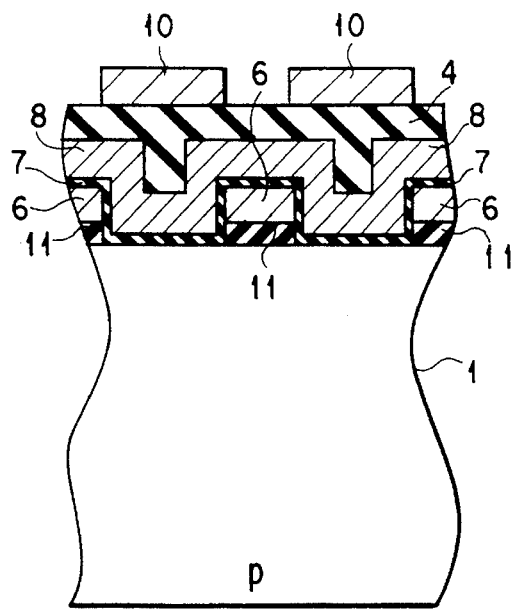
FIG. 8A
FIG. 8B
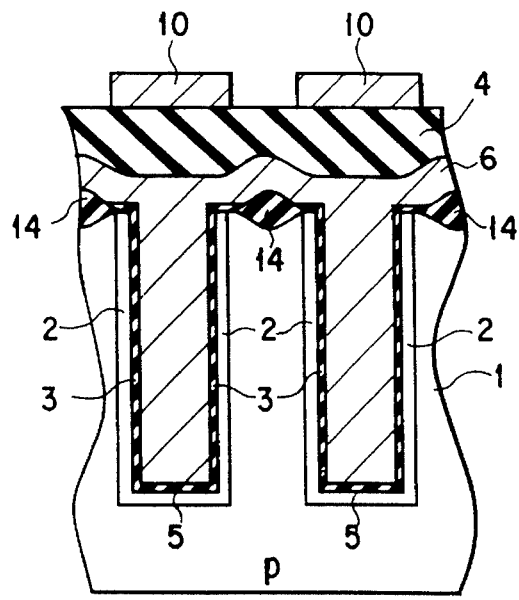
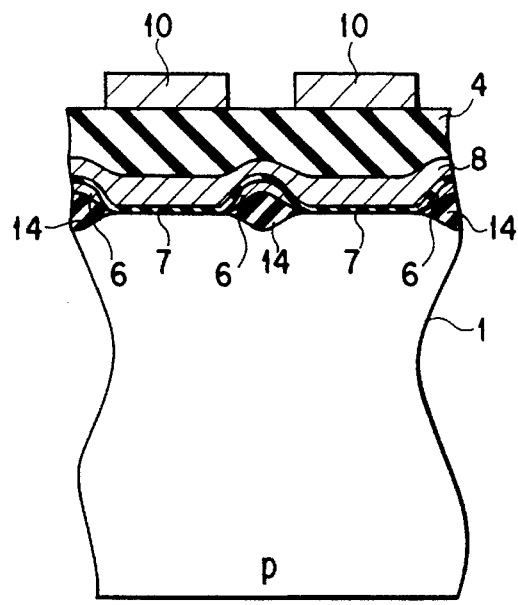
FIG. 9A
FIG. 9B

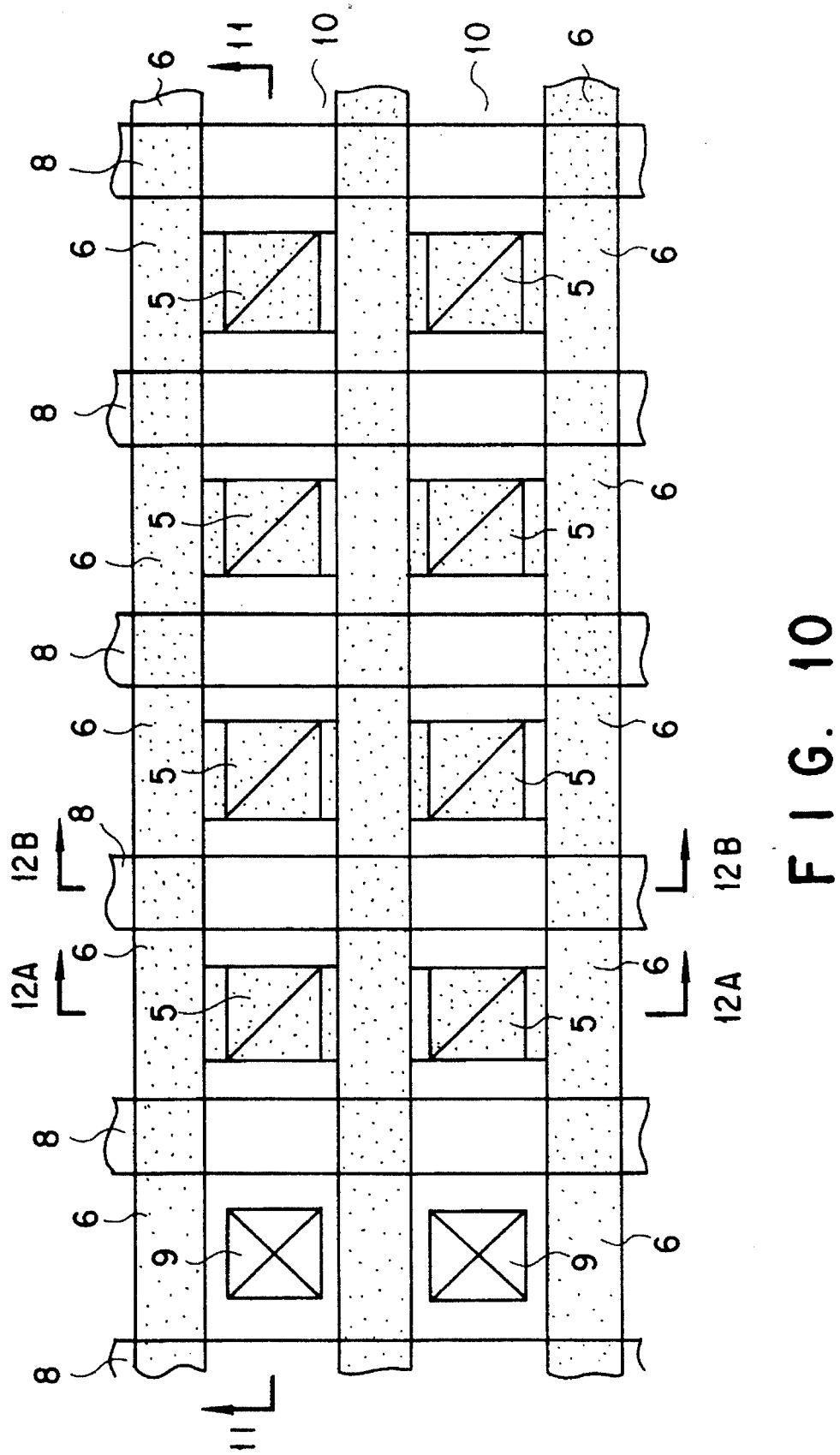
F I G. 10

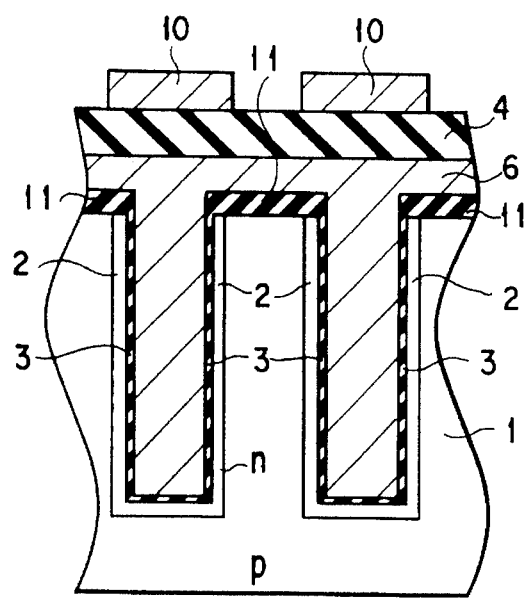
F I G. 12A
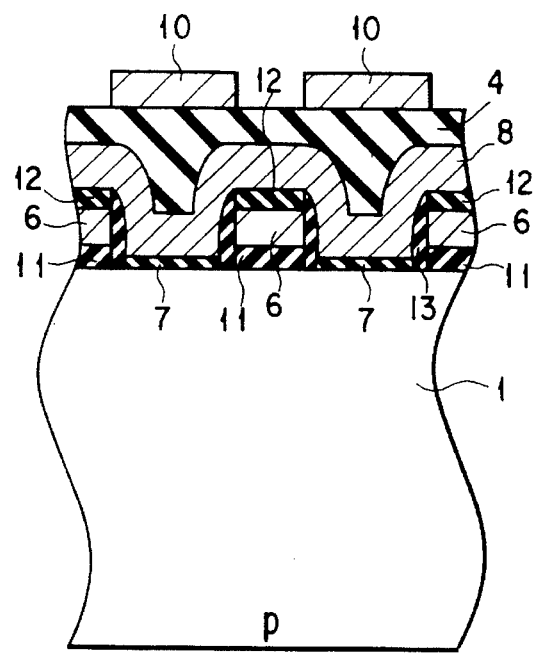
F I G. 12B
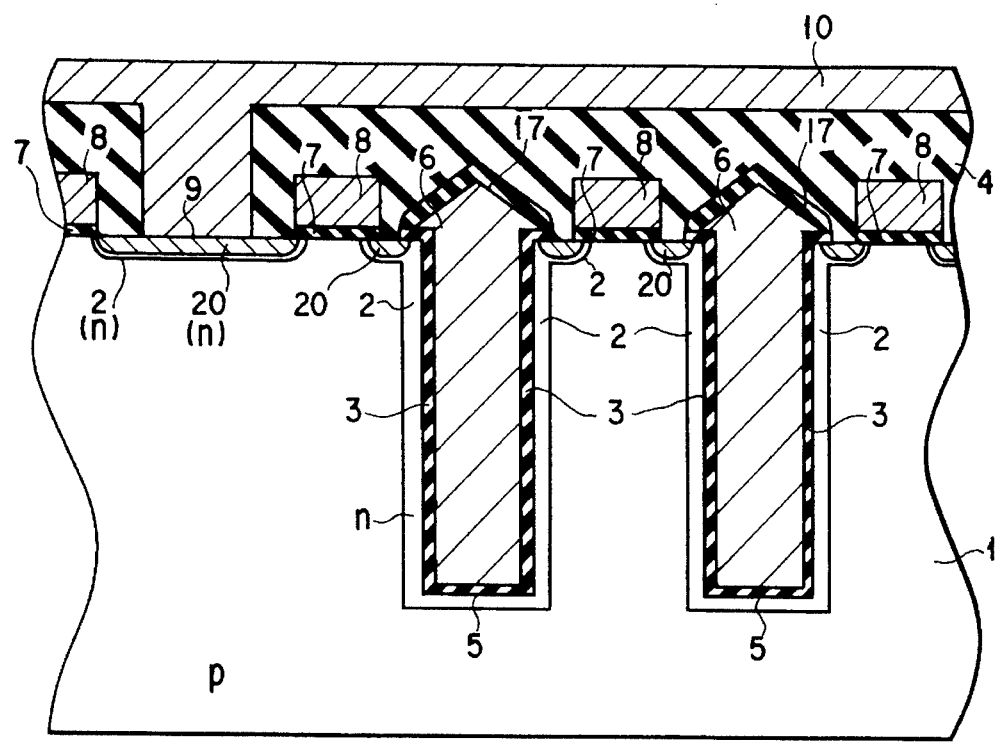
F I G. 13

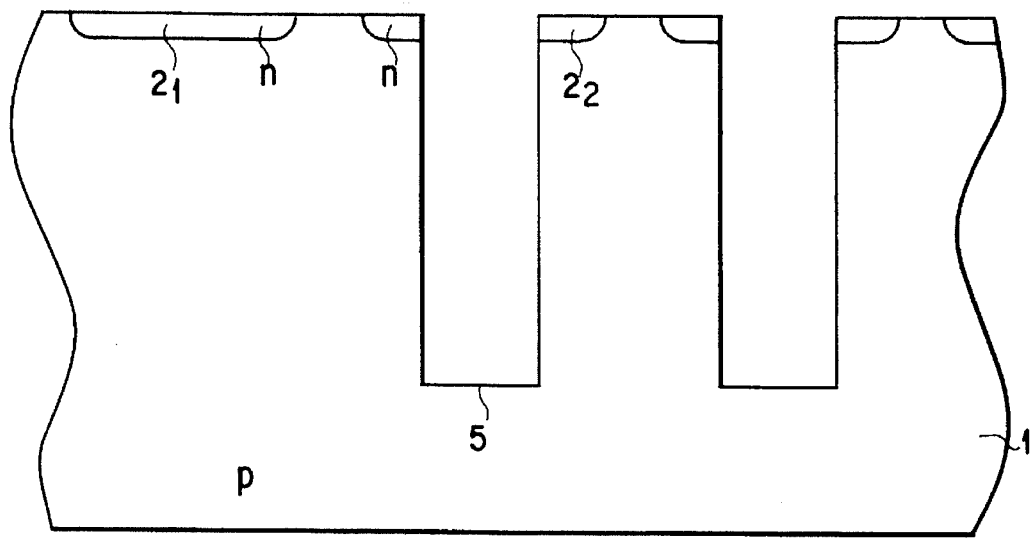
F I G. 15A
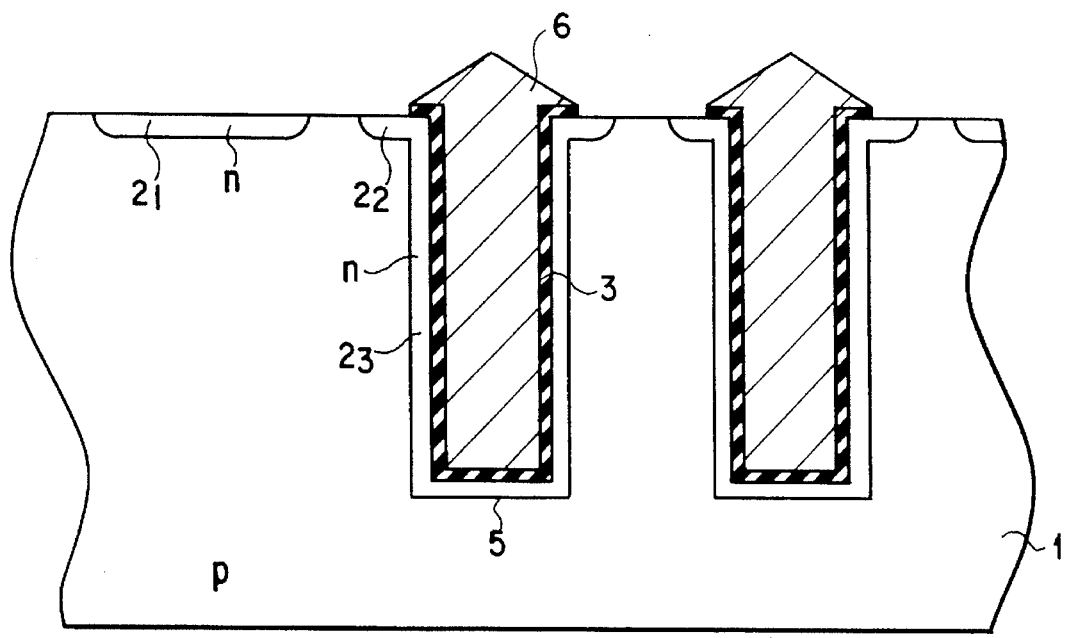
F I G. 15B

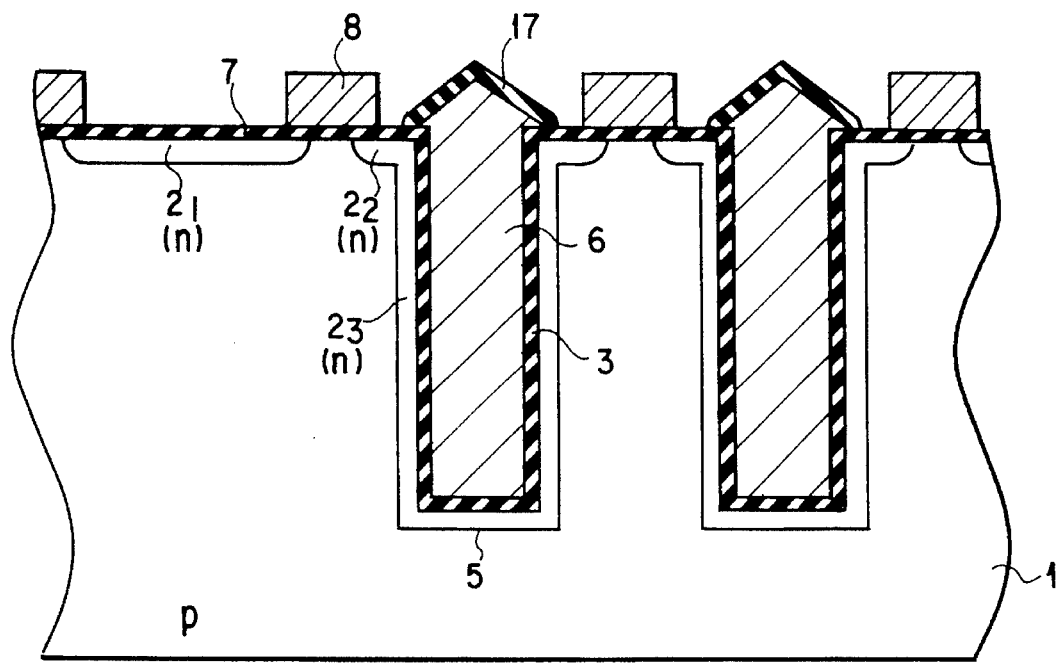
F I G. 15C
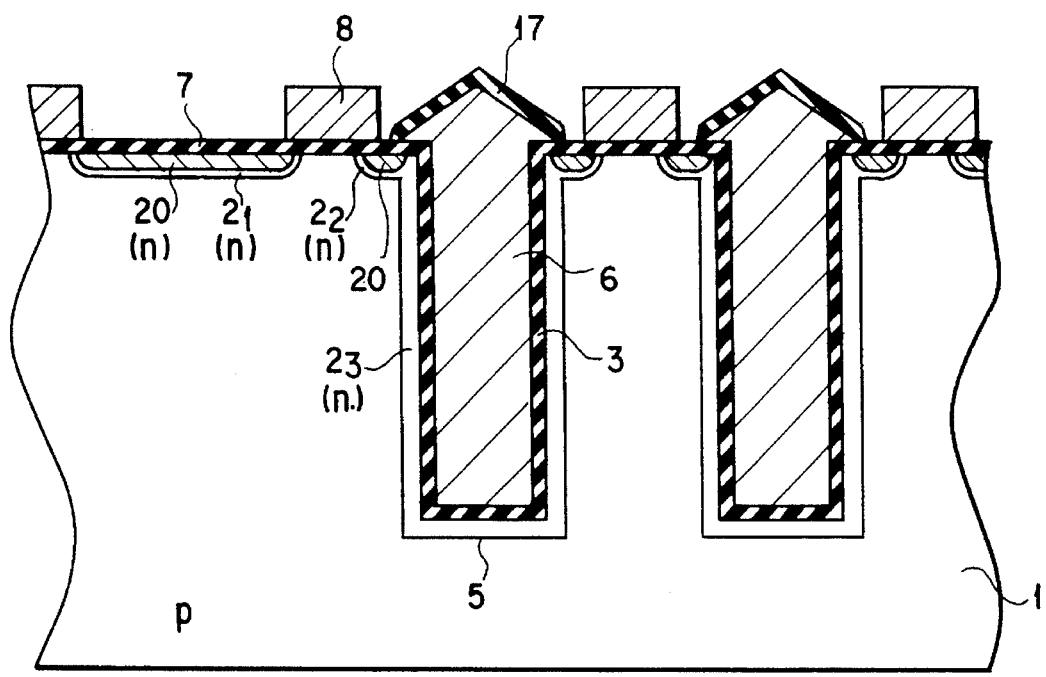
F I G. 15D

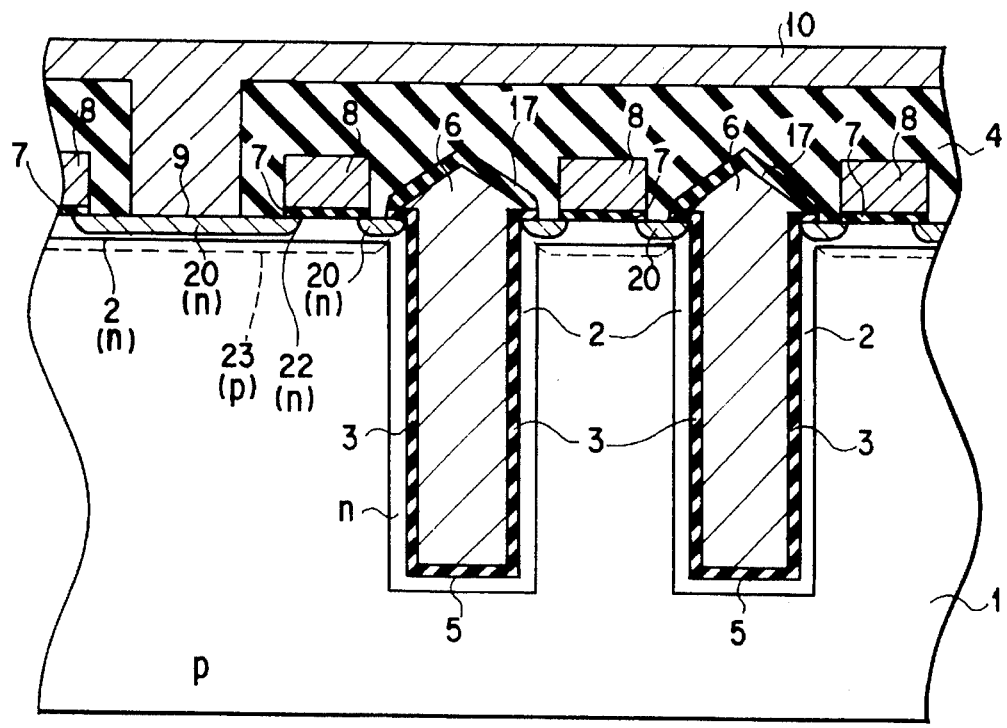
F I G. 18
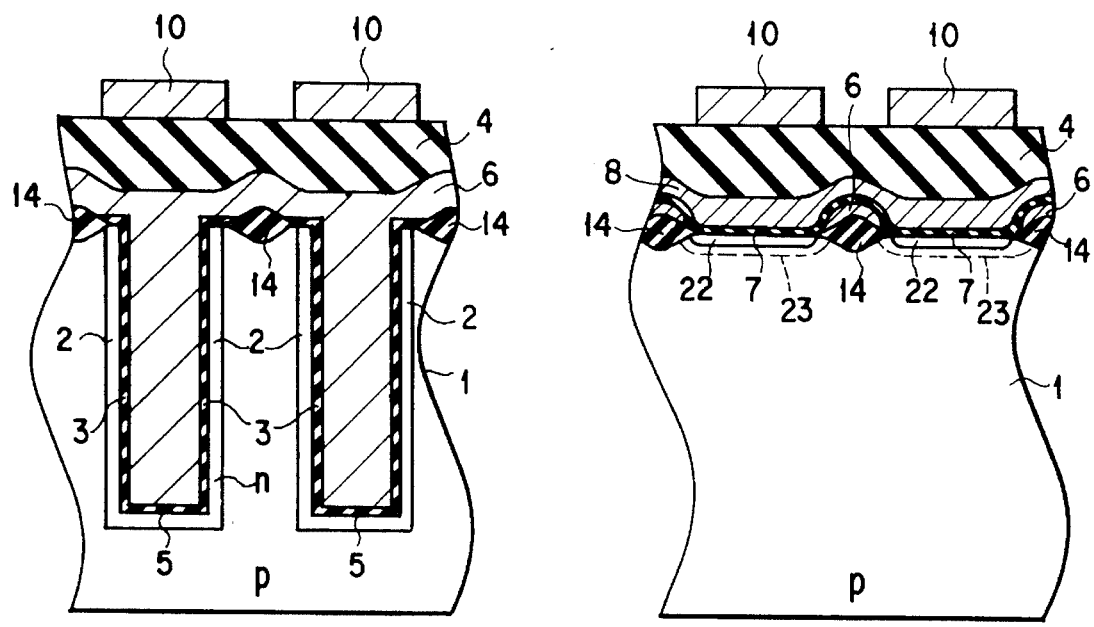
F I G. 19A
F I G. 19B

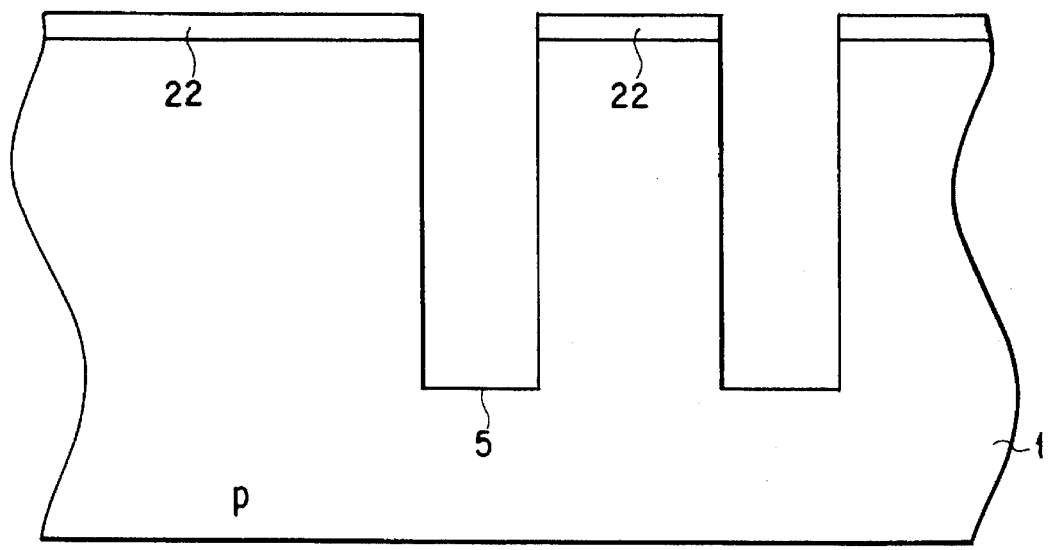
F I G. 20A
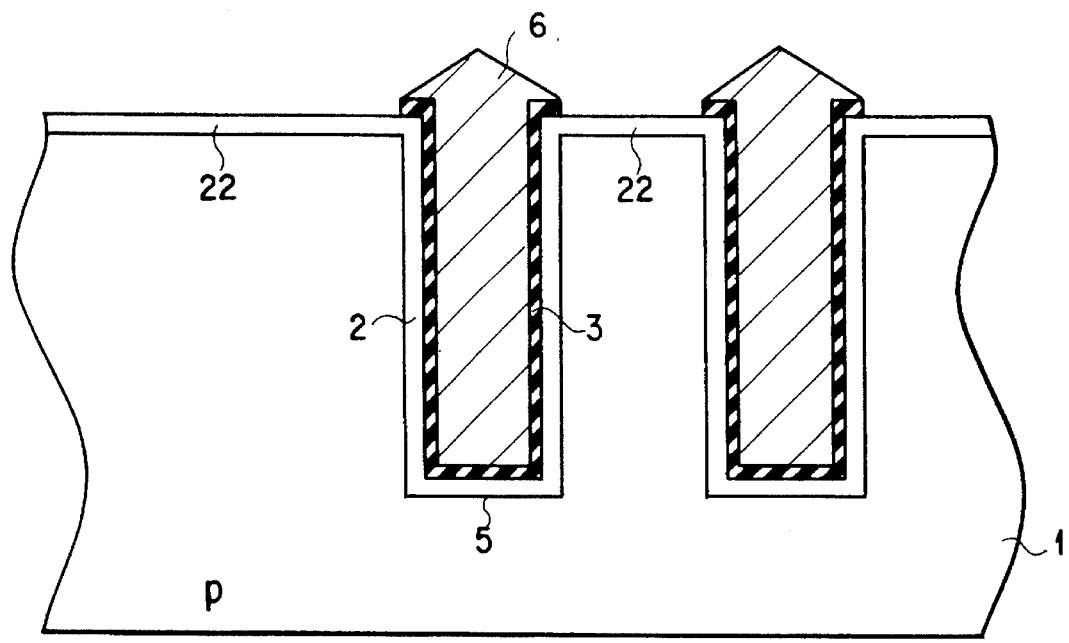
F I G. 20B

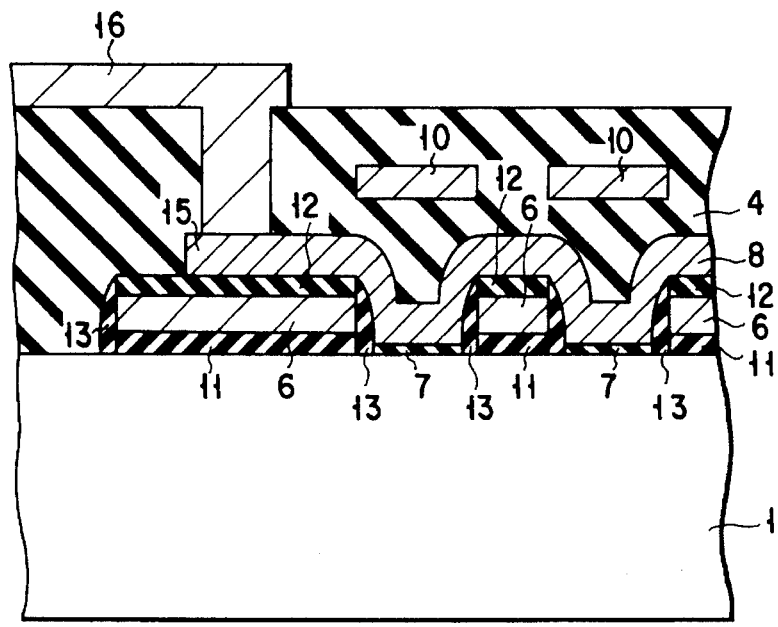
F I G. 22
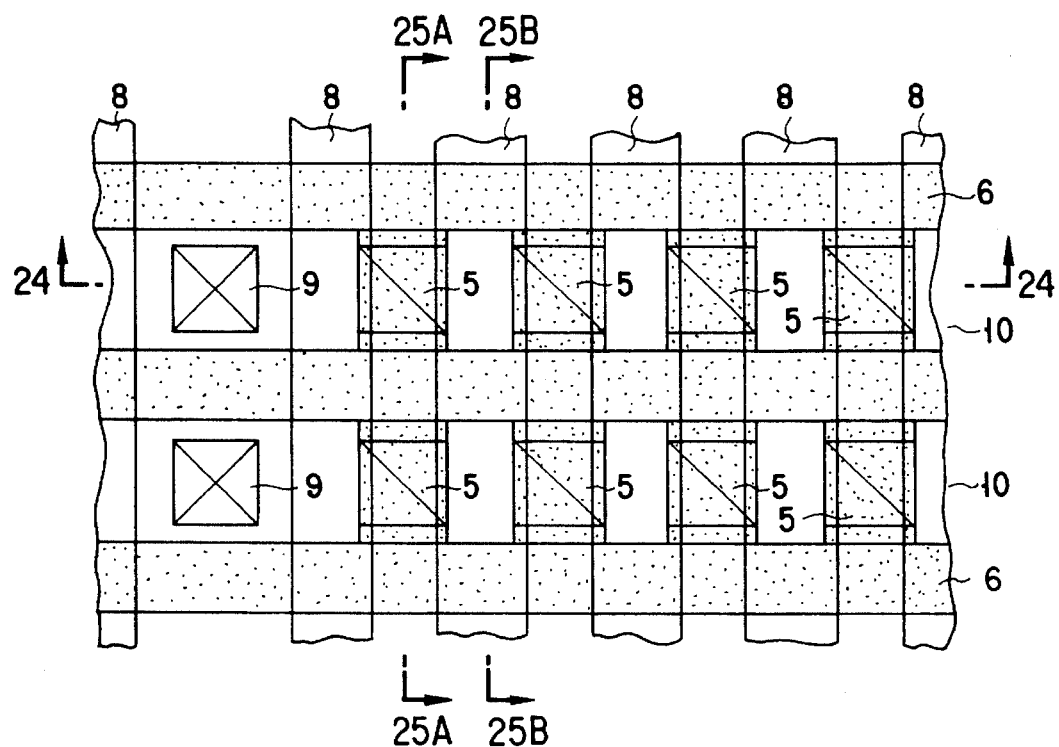
F I G. 23

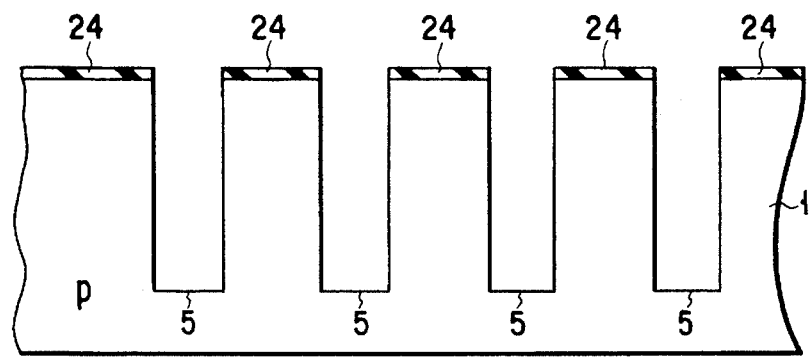
F I G. 28A
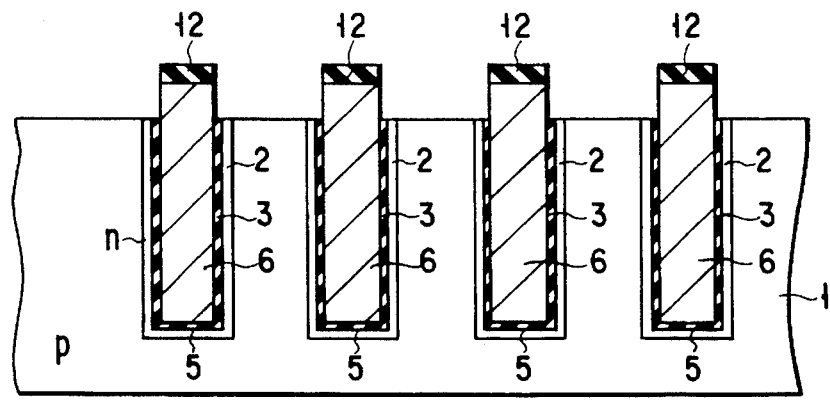
F I G. 28B
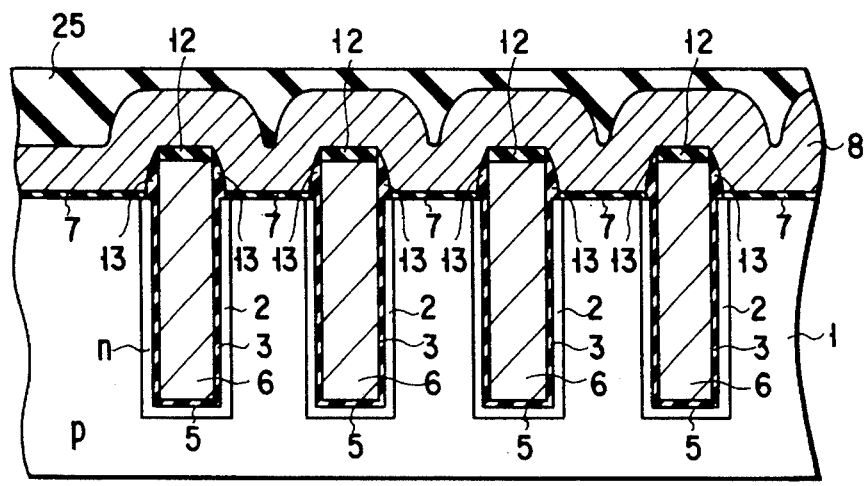
F I G. 28C

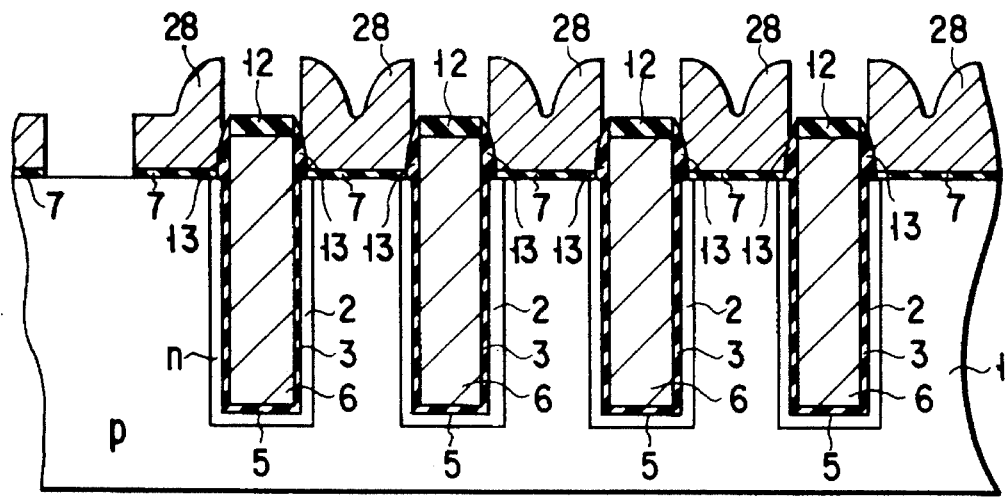
F I G. 31D
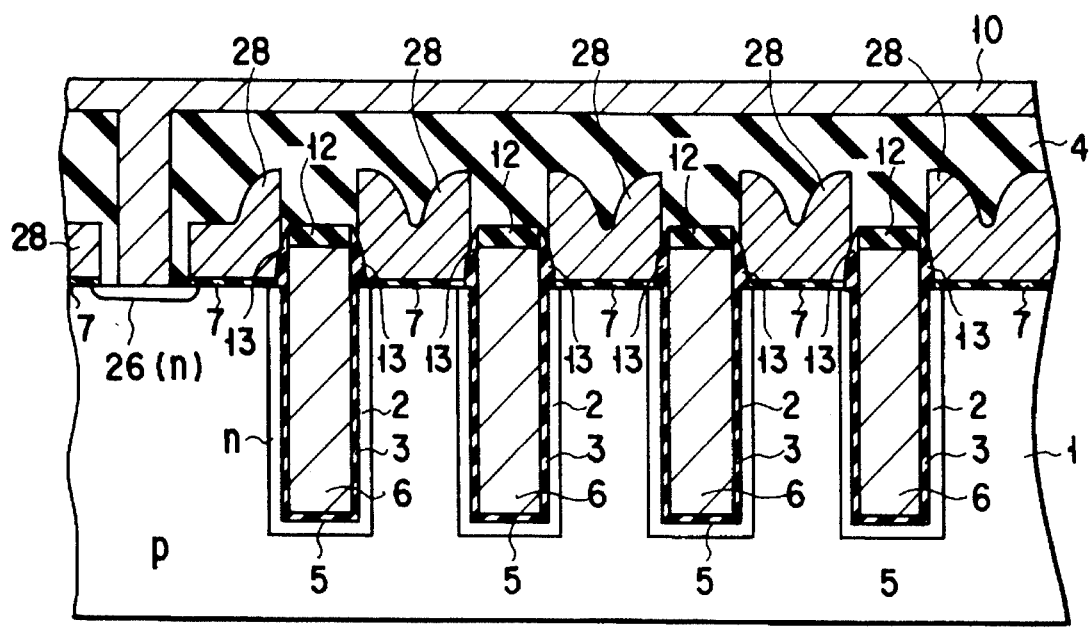
F I G. 31E

SEMICONDUCTOR MEMORY APPARATUS

BACKGROUND OF THE INVENTION

1. Field of the Invention

The present invention relates to a semiconductor memory device and method for manufacturing the same and, in particular, to a memory structure for a dynamic RAM (DRAM) and method for manufacturing the same.

2. Description of the Related Art

In recent years, a NAND type memory array structure has been proposed which includes a serial array of MOS transistors and information storage capacitors each connected to the source (or drain) of the MOS transistor. This structure is disclosed, for example, in K. Kimura et al. "A Block-Oriented RAM with Half-Sized DRAM Cell and Quasi-Folded Data-Line Architecture", 1991 ISSCC, pp 106–107. As a capacitor for such a memory array, a stacked type capacitor has usually been used.

FIG. 1 shows a planar layout of an ordinary stacked capacitor type memory array and FIG. 2 is a cross-sectional view as taken along line 2—2 in FIG. 1. Four MOS transistors T1, T2, T3, T4 and four capacitors C1, C2, C3, C4 are so provided between a bit line contact 111 and a field oxide film 103 at a semiconductor substrate that these transistors and capacitors are alternately arranged in that array. The MOS transistor is comprised of a gate 108 and source and drain regions 109 provided one at each side of the gate 108 in a surface portion of the semiconductor substrate 101 with a gate insulating film 107 formed therebetween. The transistors are connected in a serial array in such a manner that the source and drain regions are shared by the adjacent transistors. The capacitor has a capacitor electrode 106 on the source and drain regions 109 and a plate electrode 122 overlying the capacitor electrode 106 with a capacitor insulating film 121 provided therebetween. In FIG. 2, reference numerals 112 and 113 represent an insulating interlayer and a bit line, respectively.

In the NAND type memory cell array system having the serial array of the MOS transistors, one bit line contact has only to be provided relative to one memory cell array and it is only necessary to provide less number of the bit line contacts than in other memory cell systems so that a cell size becomes smaller.

With the above-mentioned memory cell structure, however, the following problems have been encountered. That is, since the capacitor is of a stacked type and the cell area is restricted to a small area, a very tall capacitor has to be formed so as to obtain a necessary storage capacity. For this reason, when an overlying connection layer, such as a bit line, is formed, a step on an underlying layer surface is as large as over 1 µm, that is, a very large step is involved, so that the formation of an overlying connection layer has become very difficult.

As a means for solving the above-mentioned drawbacks of the stacked capacitor, proposals have been made to form a buried type capacitor on the bottom of a trench in the substrate and to form a vertical type transistor on the trench. Such a structure is shown, for example, in W. F. Richardson et al. "A Trench Transistor Cross-Point DRAM Cell", 1985 IEDM, pp 714–717. This memory cell structure uses a trench type capacitor and can advantageously obtain an adequate storage capacitor readily by forming a deep trench. However, there is the following problem with such memory cell structure. That is, the transistor used is of a vertical MOS type and, for this reason, the side surface of the trench formed by an RIE (reactive ion etching) method is used as a channel region. There is a possibility that the insulating property of the gate insulating film or transistor characteristics will be affected by a damaged layer formed on the side surface of the trench when RIE is performed.

With the NAND type memory cell array structure using the stacked type capacitor, it has been difficult to obtain an adequate storage capacity when a high integration density unit is formed. Further, a very large step or steps are formed on a underlying layer surface when an overlying connection layer, such as a bit line, is formed. Therefore, the manufacturing steps have become difficult.

It may be considered that the trench type capacitors should be used, but there is possibility that the property of the gate insulating film and characteristics of the transistor will be adversely affected by a damaged layer formed on the side surface of the trench.

SUMMARY OF THE INVENTION

It is accordingly the object of the present invention to provide a NAND cell configuration type semiconductor memory device which can obtain an adequate storage capacity without raising a step on an underlying layer surface, when an overlying connection layer, such as a bit line, is formed, and can have its gate insulating film characteristics and transistor characteristics unaffected by a damaged layer on the side surface of trenches.

The features of the present invention lie in that, in order to obtain a greater storage capacity, a MOS capacitor is provided, as an information memory capacitor, by burying a capacitor electrode in a corresponding trench with a capacitor insulating film interposed therebetween and a MOS transistor is formed on the upper surface of a silicon substrate, not on the side surface of the trench. It is, therefore, possible to achieve microminiaturized memory cells.

According to a first aspect of the present invention, there is provided a semiconductor memory device comprising:

a semiconductor substrate having memory cell area;

a plurality of trenches selectively formed in the memory cell area aligning in certain intervals; and a plurality of memory cell arrays provided in the memory cell area, each of the memory cell arrays comprising;

a plurality of MOS transistors connected in a serial array, each of the transistors having a gate electrode above the substrate with a gate insulating film formed therebetween and source and drain regions formed in the substrate on both sides of the gate electrode; and a plurality of capacitors each formed in a corresponding one of the trenches, each of the capacitors including;

a charge storage layer formed on an inner wall of each of the trenches and connected integrally to one of the source and drain regions of each of the transistors;

a capacitor insulating film formed on the charge storage layer; and a capacitor electrode formed on the capacitor insulating film so as to bury each of the trenches and extending to the surface of the substrate, the capacitor electrode being formed on the surface of the substrate except for at least formation areas of the transistors.

According to a second aspect of the present invention, there is provided a semiconductor memory device comprising:

a semiconductor substrate having memory cell area of a first conductivity type;

a plurality of first diffusion layer areas of a second conductivity type provided in the memory cell area aligning at certain intervals;

a plurality of trenches selectively formed in the first diffusion layer areas;

a plurality of memory cell arrays provided in the memory cell area, each of the memory cell arrays comprising a plurality of MOS transistors arranged in a serial array and capacitors connected to the transistors respectively, wherein the capacitors are provided in the trenches respectively, each of the capacitors including:
- a charge storage layer of a second conductivity type formed on a inner wall of each of the trenches and connected integrally to corresponding one of the first diffusion layer areas;
- a capacitor insulating film formed on the charge storage layer;
- a capacitor electrode formed on the capacitor insulating film so as to bury each of the trenches and extending to a surface of the substrate, the capacitor electrode on the surface being formed except for at least formation areas of the transistors; and the transistors are arranged between adjacent ones of the trenches, each of the transistors including:
- a gate electrode provided above the substrate with a gate insulating film formed therebetween;
- source and drain regions provided on a surface of the substrate located on both sides of the gate electrode in an aligning direction, each of the source and drain regions being comprised of at least one of the first diffusion layer areas and a second diffusion layer area of a second conductivity type, the second diffusion layer area being formed at least on one side of the gate electrode in an aligning direction and overlapping at least partly with corresponding one of the first diffusion layer areas.

According to a third aspect of the present invention, there is provided a semiconductor memory device comprising:

a semiconductor substrate having a memory cell area of a first conductivity type;

a plurality of trenches selectively formed in the memory cell area aligning at certain intervals;

a plurality of memory cell arrays provided in the memory cell area, each of the memory cell arrays comprising a plurality of MOS transistors arranged in a serial array and capacitors connected to the transistors respectively, wherein the capacitors are provided in the trenches respectively, each of the capacitors including:
- a charge storage layer of a second conductivity type formed on a inner wall of each of the trenches;
- a capacitor insulating film formed on the charge storage layer;
- a capacitor electrode formed on the capacitor insulating film so as to bury each of the trenches and extending to a surface of the substrate, the capacitor electrode on the surface being formed except for at least formation areas of the transistors; and the transistors are arranged between adjacent ones of the trenches, each of the transistors including:
- a gate electrode provided above the substrate with a gate insulating film formed therebetween;
- source and drain regions provided on both sides of the electrode in an aligned direction, each of the source and drain regions being comprised of the charge storage layer.

Here, the preferred forms of the present invention are as follows:

(1) The capacitor electrode serves as a field plate and effects an element isolation between the adjacent memory cell arrays.

(2) On the upper and side areas of a capacitor electrode portion above the substrate surface an insulating film is so formed as to be thicker than a gate insulating film of the MOS transistor.

(3) A contact to a gate electrode of the MOS transistor is formed above the capacitor electrode brought out to an outside of the memory cell area.

According to a fourth aspect of the present invention, there is provided a method for manufacturing a semiconductor memory device having memory cell arrays provided in a memory cell area in a semiconductor substrate and each comprised of a plurality of MOS transistors arranged in a serial array and capacitors connected to the transistors, comprising the steps of:

forming, in the memory cell area of a first conductivity type in the semiconductor substrate, a plurality of first diffusion layer regions of a second conductivity type at certain intervals in an array;

forming trenches each in the first diffusion layer regions;

forming a charge storage layer of a second conductivity type each on an inner wall of each of the trenches for connection to each of the first diffusion layer regions;

forming a capacitor insulating film each on the charge storage layer;

forming a capacitor electrode on the capacitor insulating film so as to bury each of the trenches and extend to a surface of the substrate;

patterning the capacitor electrode formed on the surface to make openings for at least formation areas of the transistors;

forming an overlying insulating film on the capacitor electrode;

making exposed substrate surfaces between those adjacent trenches;

forming gate electrodes each above the exposed substrate surfaces with a gate insulating film interposed therebetween respectively; and forming second diffusion layer regions of a second conductivity type using the gate electrodes each as a mask to provide source and drain regions.

According to a fifth aspect of the present invention, there is provided a method for manufacturing a semiconductor memory device having memory cell arrays provided in a memory cell areas in a semiconductor substrate and each comprised of transistors arranged in a serial array and capacitors connected to the transistors, comprising the steps of:

forming, in a memory cell area of a first conductivity type in the semiconductor substrate, trenches in a way to be arranged at certain intervals as an array;

forming a charge storage layer of a second conductivity type on an inner wall of each of the trenches;

forming a capacitor insulating film on the charge storage layer;

forming a capacitor electrode on the capacitor insulating film so as to bury each of the trenches and extend to a surface of the substrate;

patterning the capacitor electrode formed on the surface to make openings for at least formation areas of the transistors;

forming an overlying insulating film on the capacitor electrode;

making a mesh-like pattern on the capacitor electrode and the overlying insulating film to obtain exposed substrate surfaces between the trenches;

forming a side insulating film on a side surface of the capacitor electrode above the substrate; and forming gate electrodes each above the exposed substrate surfaces with a gate insulating film interposed therebetween respectively.

According to the present invention, the MOS capacitor is formed by burying a capacitor electrode in the corresponding trench with a capacitor insulating film interposed therebetween. It is thus possible to obtain an adequate storage capacity in a small area. Further, the capacitor electrode is also formed on the substrate surface to provide a field plate. By doing so, there is no need to provide a field insulating film for achieving separation between those memory cell groups. Thus the device manufacturing steps become simplified.

Further the capacitor electrode is provided in the trench and on the substrate surface so that an adequate storage capacity can be realized without raising a step on an underlying layer surface when an overlying connection layer, such as a bit line, is formed. In addition, the MOS transistor is formed at the silicon substrate surface and it is possible to achieve a high-reliable memory cell unaffected by an RIE damaged layer and to achieve a micro miniaturized device, by adopting a cell structure free from any gate offset in the transistor, while at the same time ensuring an improved characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 8A and 8B are cross-sectional views taken along lines 8A—8A and 8B—8B, respectively, in FIG. 6;

FIGS. 9A and 9B show a memory cell configuration of a DRAM according to a third embodiment of the present invention, the former being a cross-sectional view of a capacitor area and the latter to a transistor area;

FIG. 10 is a plan view showing a cell array configuration of a DRAM according to a fourth embodiment of the present invention;

FIGS. 12A and 12B are cross-sectional views taken along lines 12A—12A and 12B—12B, respectively, in FIG. 11;

FIG. 13 is a cross-sectional view showing a cell array configuration of a DRAM according to a fifth embodiment of the present invention;

FIGS. 15A to 15D are cross-sectional views showing the manufacturing steps of a DRAM according to the fifth embodiment of the present invention;

FIG. 18 is a cross-sectional view showing a cell array configuration of a DRAM according to a sixth embodiment of the present invention;

FIGS. 19A and 19B are cross-sectional views showing a DRAM according to a sixth embodiment of the present invention, the former corresponding to a capacitor area and the latter to a transistor area;

FIGS. 20A to 20D are cross-sectional views showing the manufacturing steps of the sixth embodiment of the present invention;

FIG. 22 is a cross-sectional view taken along line 22—22 in FIG. 21;

FIG. 23 is a plan view showing a cell array configuration of a DRAM according to an eighth embodiment of the present invention;

FIGS. 28A to 28F are cross-sectional views showing the manufacturing steps of a DRAM according to a ninth embodiment of the present invention;

FIGS. 31A to 34E are cross-sectional views showing the manufacturing steps of the DRAM according to the tenth embodiment;

FIG. 32 is a plan view showing a cell array configuration of a DRAM according to an eleventh embodiment of the present invention;

FIG. 33 is a cross-sectional view taken along line 33—33 in FIG. 32;

FIGS. 34A and 34 B are cross-sectional views taken along line 34A to 34A and 34B—34B, respectively, in FIG. 32.

DETAILED DESCRIPTION OF THE PREFERRED EMBODIMENTS

Figure 1:
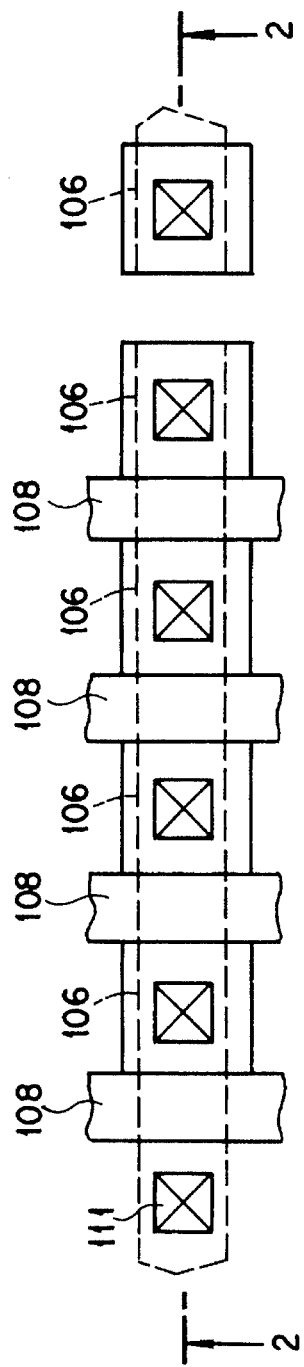
FIG. 1 is a plan view showing a memory cell array using ordinary stacked capacitors.
Figure 2:
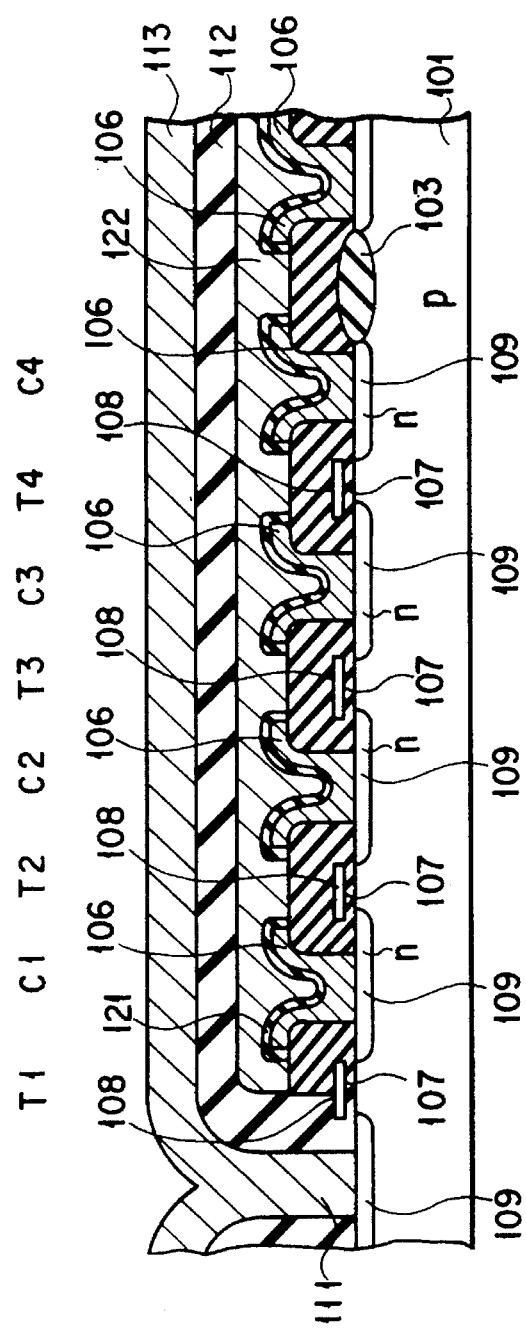
FIG. 2 is a cross-sectional view showing the memory cell array taken along line 2—2 in FIG. 1.
Figure 3:
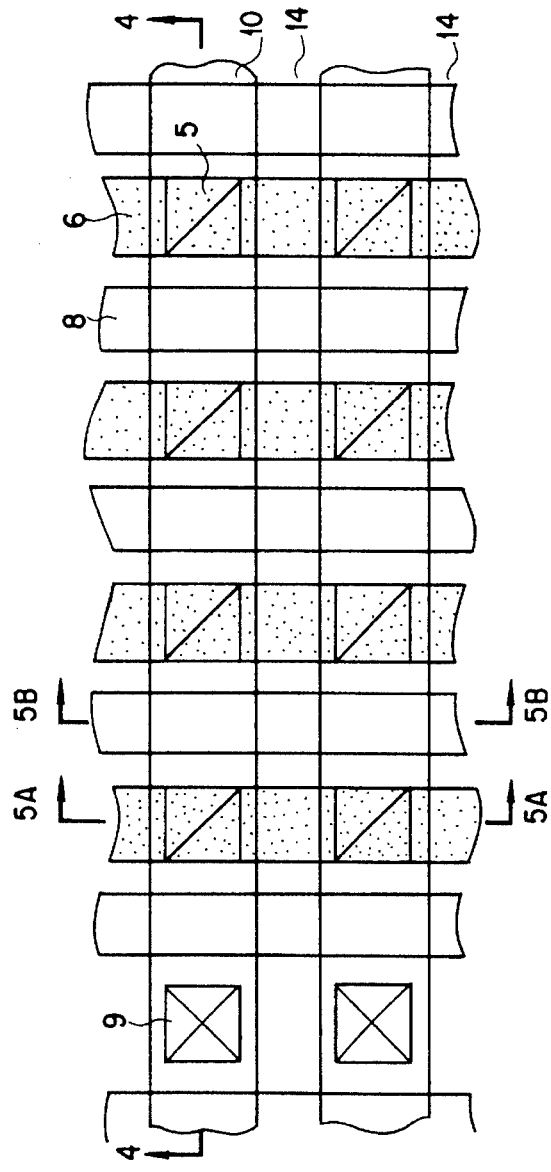
FIG. 3 a plan view showing a cell array configuration of a DRAM according to a first embodiment of the present invention.

The embodiments of the present invention will be explained below with reference to the accompanying drawings. The same reference numerals are employed to designate parts or elements corresponding to those shown throughout the specification.

[First Embodiment]

The cell array configuration of a DRAM according to a first embodiment of the present invention will be explained with reference to FIGS. 3 to 5A and 5B. As evident from FIGS. 3, 5A and 5B, according to the present invention, a memory cell area in a p-type silicon substrate 1 is defined by a field oxide film 14 into stripe-like element areas. A memory cell array (NAND type cell array) is provided within the element area surrounded by the field oxide film 14 and comprised of a plurality of (four in the present embodiment) memory cells connected in series array to a bit line 10, each memory cell having a MOS transistor and a trench capacitor.

Figure 4:
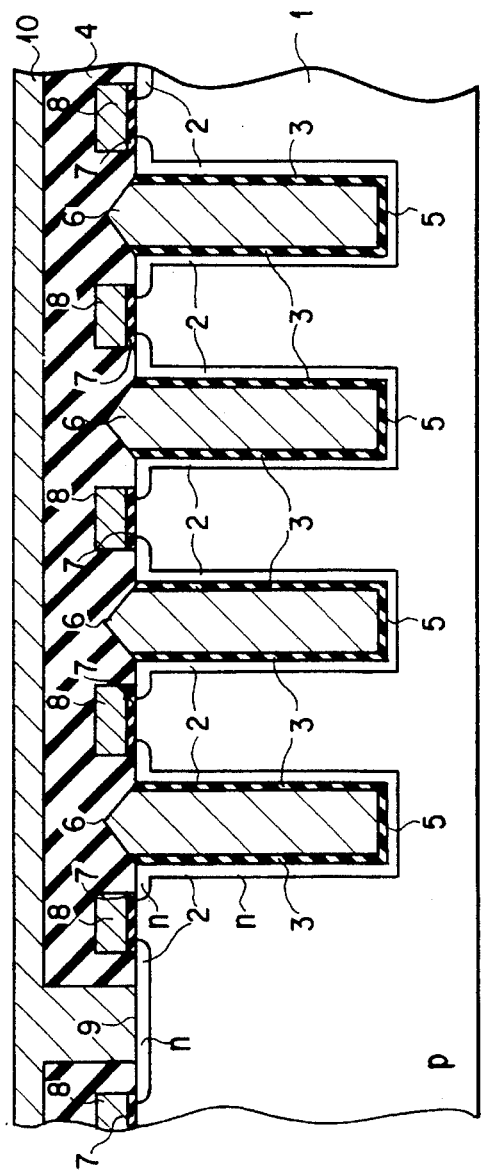
FIG. 4 is a cross-sectional view taken along line 4—4 in FIG. 3.
Figure 5A:
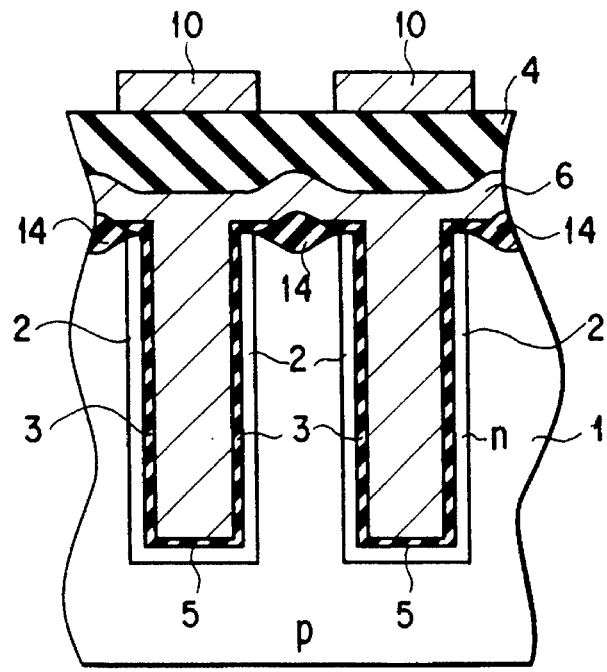
FIGS. 5A and 5B are cross-sectional views taken along lines 5A—5A and 5B—5B, respectively, in FIG. 3.

As shown in FIG. 4, the trench capacitor is comprised of four trenches 5 in the element area in one NAND type cell, an n-type diffusion layer (charge storage layer) 2 is formed on the inner wall of each trench 5 and a capacitor electrode 6 is buried in the respective trench 5 with a capacitor insulating film 3 provided therebetween. It is to be noted that the adjacent trenches of the adjacent memory cell group are connected to each other as shown in FIG. 5A.

The MOS transistor is provided adjacent to the respective trench 5 as shown in FIG. 4. Stated in more detail, the MOS transistor is such that a gate electrode 8 is formed above the surface of the substrate with a gate insulating film 7 provided therebetween and that the n-type source and drain regions 2 provide areas integral with the charge storage layers 2 formed one at each end side of the gate electrode 8. The gate electrodes 8 are continuously patterned, in a direction in which the gates of the adjacent cell arrays are connected, whereby a word line is provided.

A portion of the n-type diffusion layer 2 of a MOS transistor at one end portion of the NAND type cell is connected to a bit line 10 via a corresponding bit line contact 9. The bit line 10 is patterned in a direction orthogonal to the gate electrode 8. Further, the capacitor electrode 6 is patterned in a direction parallel to the gate electrode 8 to provide a so-called plate electrode. Reference numeral 4 in FIGS. 3 to 5A and 5B shows an insulating interlayer.

According to the present embodiment thus structured, since the capacitor is provided in the trench 5, it is possible to secure an adequate storage capacity and, further, any step on an underlying layer surface of the bit line 10 can also be reduced, thereby facilitating the formation of an overlying connection layer when the bit line is formed.

[Second Embodiment]

The cell array configuration of a DRAM according to a second embodiment of the present invention will be explained below with reference to FIGS. 6 to 8A and 8B.

Figure 5B:
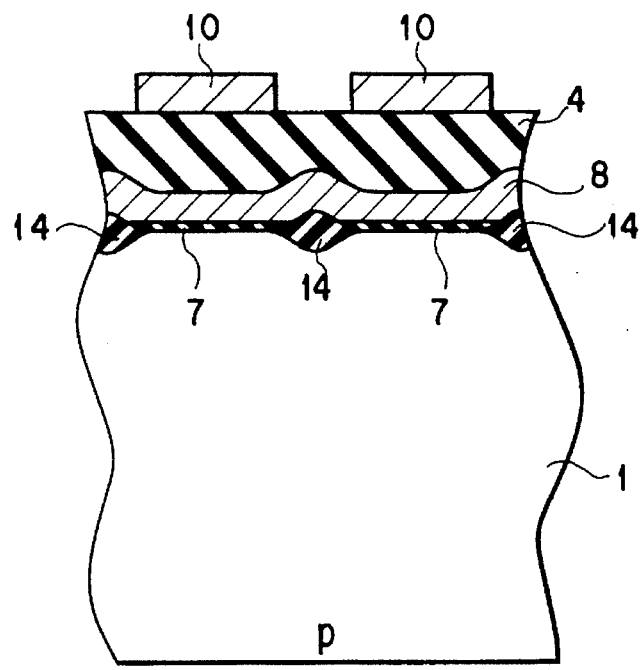

The second embodiment of the present invention is different from the first embodiment in that a field plate separation is provided to achieve an element isolation between memory cell arrays. In the second embodiment, a capacitor electrode 6 is also provided on the surface of a silicon substrate 1 with an oxide film 11 provided therebetween, the oxide film 11 being thicker than insulating films 3, 7. Those capacitor electrodes 6 are formed in a mesh-like pattern except for MOS transistor areas alone. According to the second embodiment, no field oxide film 14 as shown in FIGS. 5A and 5B is formed at a cell area and, as shown in FIGS. 8A and 8B, a so-called field plate isolation is achieved by the capacitor electrodes 6.

This specific arrangement enables the same advantage as in the first embodiment to be obtained. In addition, it is also possible to obviate the necessity for providing the field oxide film 14 and hence to lower a manufacturing cost involved. Further, the capacitor electrodes 6 are provided in a mesh-like pattern and less affected by a potential variation on a word line than in the stripe-like pattern. It is, therefore, possible to provide a greater noise margin.

In the second embodiment, the oxide film 11 is present below the capacitor electrode 6 but a capacitor insulating film 3 may be formed instead of forming the oxide film 11. As the oxide film 11, use may be made of other proper materials, such as a silicon nitride, a $Ta_2O_5$ or an $Al_2O_3$ film. These materials may be used in a stacked way.

In the second embodiment, the patterning of the capacitor electrodes 6 along a direction in which the gate electrode 8 extends substantially aligns with the pattern of a trench 5, but this is not necessarily required. That is, the capacitor electrode 6 may overhang over the silicon substrate 1 or may be so patterned as to be made narrower at the upper end side than the width of the trench 5.

[Third Embodiment]

Figure 6:
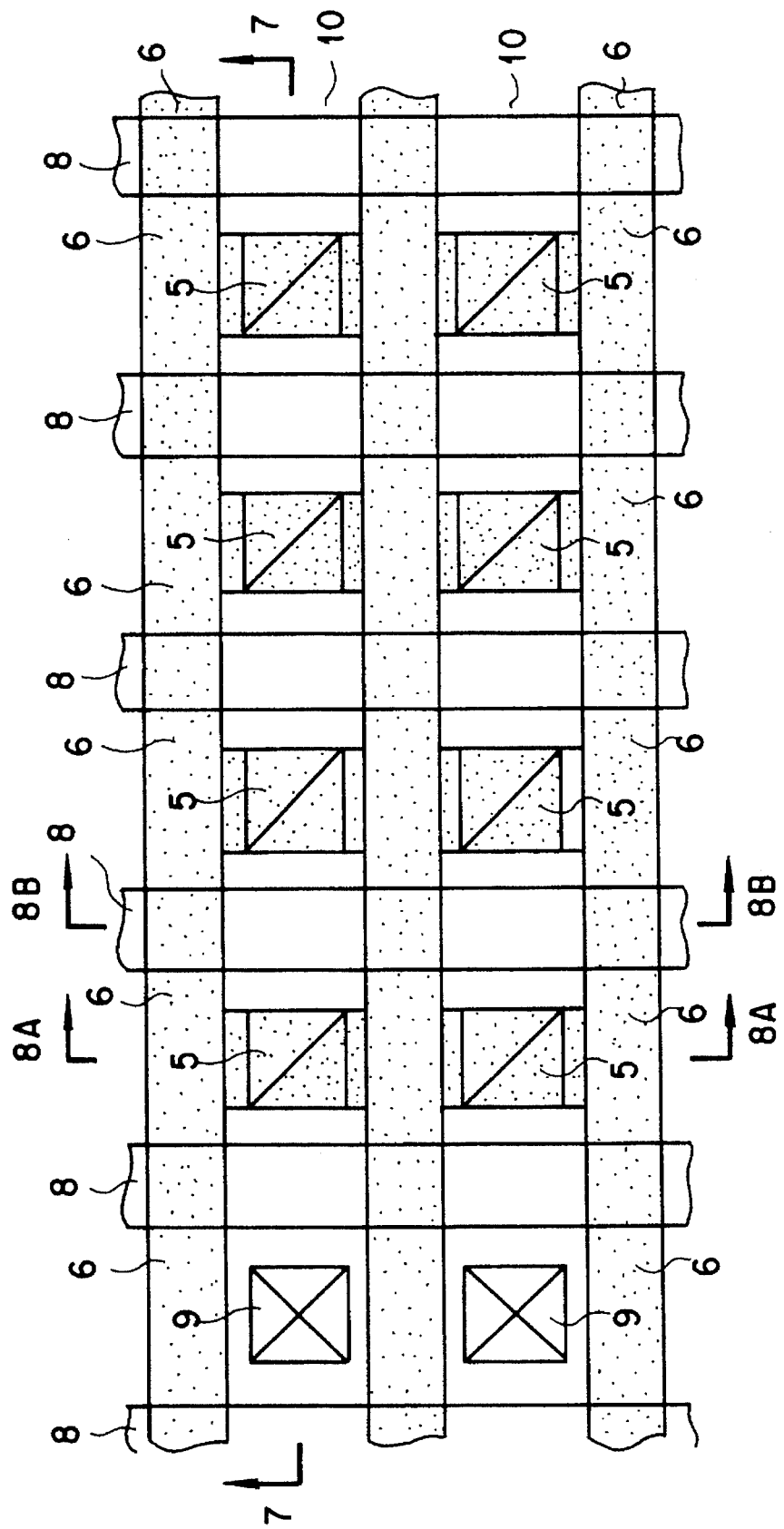
FIG. 6 is a plan view showing a cell array configuration a DRAM according to a second embodiment of the present invention.
Figure 7:
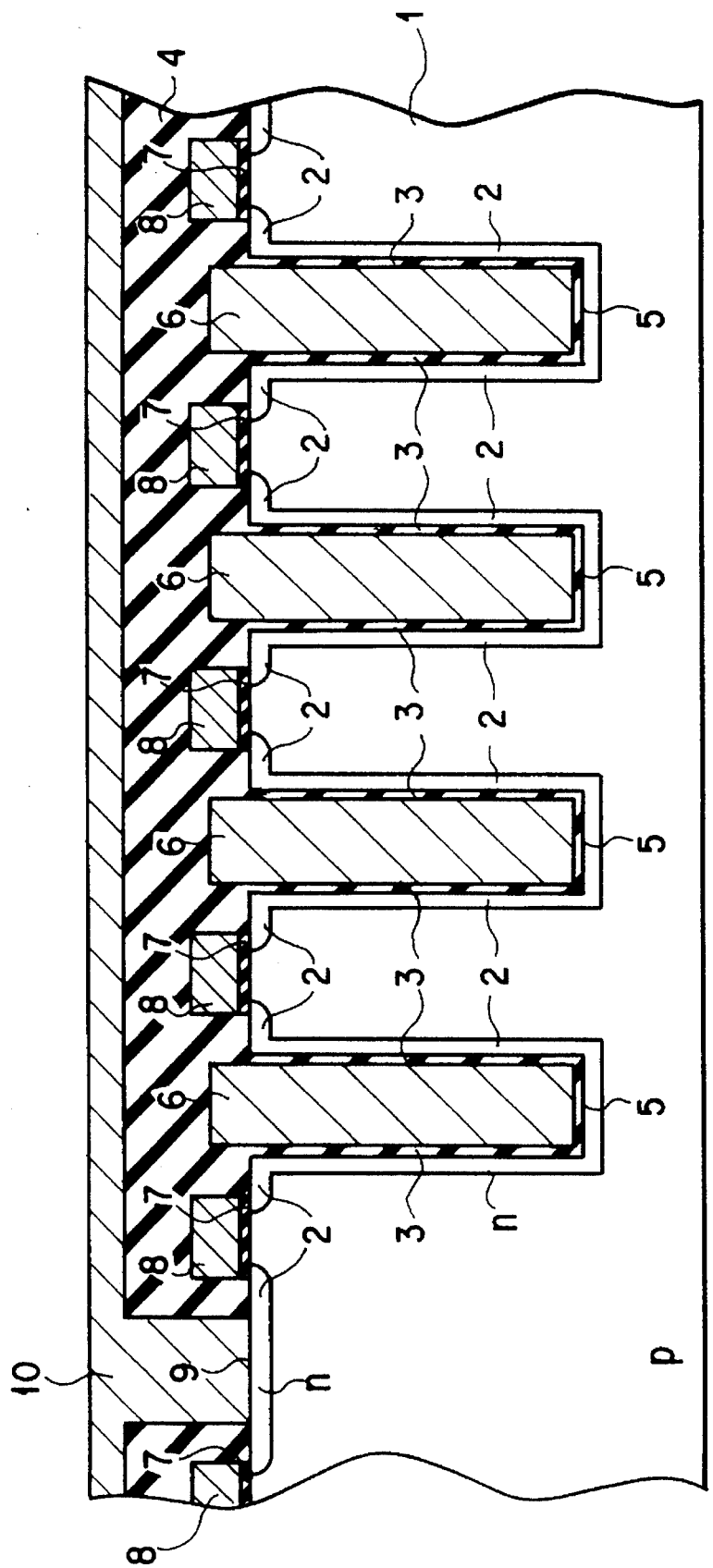
FIG. 7 is a cross-sectional view taken along line 7—7 in FIG. 6.
Figure 11:
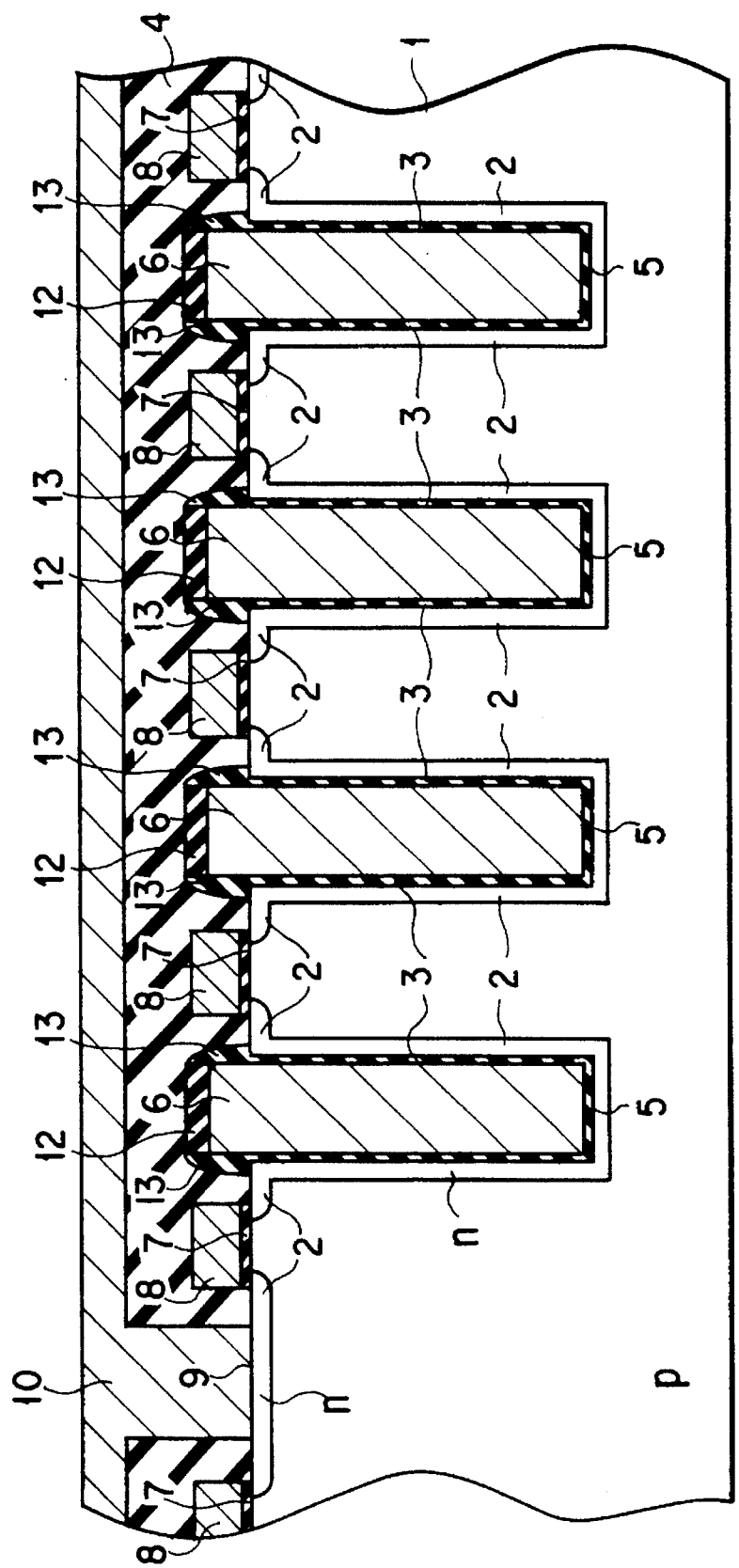
FIG. 11 is a cross-sectional view taken along line 11—11 in FIG. 10.

The plan view of a DRAM cell array in the third embodiment in FIGS. 9A and 9B is the same as in the second embodiment of FIG. 6. The corresponding cross-sectional view of the third embodiment along line 7—7 in FIG. 6 is different from one in FIG. 7 but the same as one in FIG. 4. That is, capacitor electrodes 6 are formed in a mesh-like pattern except for a MOS transistor formation area and the top surface portion of the capacitor electrode 6 between the transistors is taper-formed. A field oxide film 14 is used to achieve an element isolation between cell arrays. The views corresponding to the cross-sectional views taken along line 8A—8A and line 8B—8B in FIG. 6 are as shown in FIGS. 9A and 9B, respectively.

According to the third embodiment, since a capacitor is formed in a corresponding trench 5, it is possible to secure an adequate storage capacity and, at the same time, to lower a step on a layer surface lying under a bit line 10. For this reason, an overlying connection layer can readily be formed when the bit line is formed. Further, since the capacitor electrodes 6 are formed in a mesh-like pattern, a potential variation on a word line is less affected than in the case where isolation is achieved in the stripe-like pattern. This specific configuration allows a greater noise margin.

[Fourth Embodiment]

An cell array configuration of a DRAM according to a fourth embodiment of the present invention will be explained below with reference to FIGS. 10 to 12A and 12B.

In the fourth embodiment, a capacitor electrode 6 is provided adjacent to the surface of a silicon substrate 1 with an oxide film 11 interposed therebetween. Those capacitor electrodes are formed in a mesh-like pattern except for MOS transistor areas alone. A field plate isolation is achieved by the capacitor electrodes 6 as in the case of the second embodiment.

A relatively thick film 12 is formed on the top surface of the capacitor electrode 6 and a relatively thick film 13 is formed on the side surface of the protruded portion of the capacitor electrode 6. The capacitor electrode 6 is positively insulated from a gate electrode 8 by the oxide films 12 and 13.

This specific configuration can gain the same advantage as in the second embodiment and ensures a positive insulation between the capacitor electrode 6 and the gate electrode 8 with the use of the oxide films 12 and 13. It is, therefore, possible to obtain an excellent insulating property between these electrodes 6 and 8 and to provide a device of high reliability. A high-speed device can be expected on that device because of smaller gate capacity.

In the fourth embodiment, although the oxide film 13 is formed on the side surface of the capacitor electrode 6, the capacitor electrode 6 may be insulated from the gate electrode 8 without the use of the oxide film 13 and with the use of the gate insulating film 7. Further, as the oxide films 12 and 13, use may be made of other proper materials such as a silicon nitride, a $Ta_2O_5$ and an $Al_2O_3$ film, and these materials may be used in a stacked way. The oxide film 12 and oxide film 13 may be formed simultaneously or individually separately.

[Fifth Embodiment]

The fifth embodiment provides an improved configuration over the first through the fourth embodiments. With the NAND type DRAM using the aforementioned trench type, more precise alignment is required between a capacitor electrode 6 and a gate electrode 8 at a photolithographic step with an advance of microminiaturizing of memory cell size. In the worst case, the capacitor electrode 6 and gate electrode 8 approximate each other or overlap with each other. An adequate dose of ion is not implanted in the formation of the source and drain region 2 of a transistor. As a result, the source and drain regions are not formed beneath the gate electrode 8 and a resultant device fails to operate adequately due to such an offset structure.

If, in order to impart an adequate thickness to a mesh-like pattern of the capacitor electrodes 6 in particular, a vertically protruded formation of the electrode 6 is employed, as in the second and fourth embodiment, without imparting any taper angle, then a distance between the capacitor electrode 6 and the gate electrode 8 is narrowed and, in addition, there is also a high possibility that an offset will occur there. With the present embodiment, a diffusion layer is initially formed prior to forming a trench capacitor and gate electrode 8.

Figure 14A:
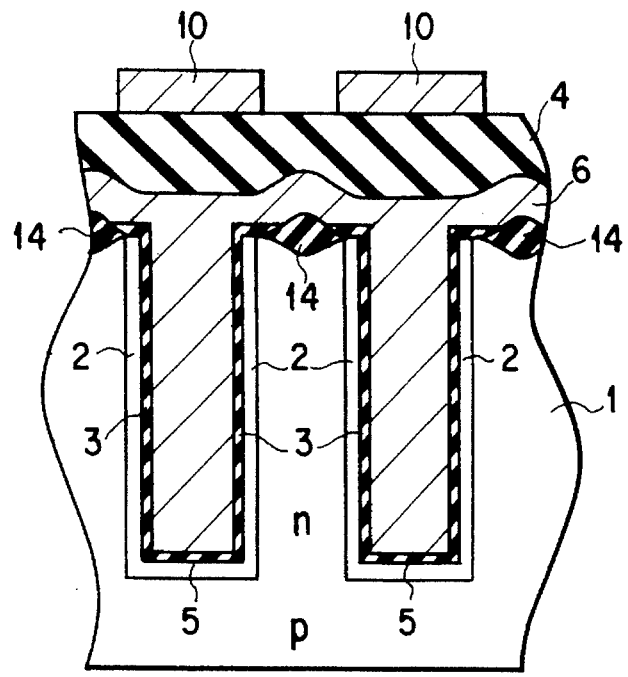
FIGS. 14A and 14B are cross-sectional views of the DRAM according to the fifth embodiment of the present invention, the former corresponding to a capacitor area and the latter to a transistor area.
Figure 14B:
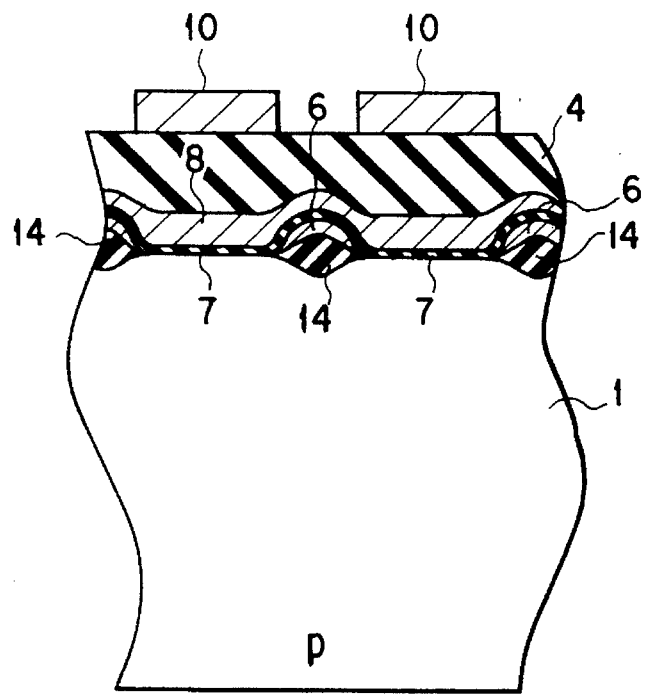

As a planar layout of the fifth embodiment is the same as the configuration of the second embodiment shown in FIG. 6, explanation will be made by referring back to FIG. 6. FIG. 13 corresponds to a cross-sectional view taken along line 7—7 in FIG. 6 with this configuration shown partly expanded. FIGS. 14A and 14B correspond to those cross-sectional views taken along line 8A—8A and 8B—8B, respectively, in FIG. 6. The fifth embodiment is similar to the first embodiment in that an element area is isolated by the field oxide film 14 and that the top area of the capacitor electrode 6 is tapered.

The fifth embodiment is characterized in that an n-type diffusion layer 20 is formed in a manner to at least partly overlap with the n-type diffusion layer 2, thus providing the source and drain regions of the transistor formed integrally therewith. The diffusion layer 20 is provided by an ion implantation step after the gate electrode 8 has been formed. The diffusion layer 2 is provided prior to forming the gate electrode 8. Even if, by doing so, the diffusion layer 20 is not adequately formed due to a close proximity of the capacitor electrode 6 to the gate electrode 8, the previously formed diffusion layer 2 serves as a source and drain so that no offset is created there.

A method for manufacturing a memory cell array according to the fifth embodiment will be explained below with reference to FIGS. 15A to 15D.

An element area and field oxide film were formed in a line array on a p-type silicon substrate 1, though not shown, by an LOCOS method. As shown in FIG. 15A, a phosphorus or arsenic ion was implanted into an element area by a photolithography step to provide an n-type diffusion layer 2. The diffusion layer 2 was formed to have a width somewhat greater than the distance between the opposing edges of adjacent gate electrodes 8 to be formed later. In a diffusion layer $2_2$ other than a diffusion layer $2_1$ for forming a bit line contact, a trench 5 was formed to have a bore smaller in size than the area of the diffusion layer $2_2$ but have a depth capable of gaining an adequate capacity.

An n-type diffusion layer $2_3$ serving as a storage electrode was formed on the inner wall of the trench 5 as shown in FIG. 15B. At this time, the diffusion layer $2_2$ was connected to the diffusion layer $2_3$ because the trench 5 was formed down into and through the diffusion layer $2_2$. Then a capacitor insulating film 3 was formed as an oxide film and a capacitor electrode (plate electrode) 6 was formed as an n-type polysilicon by an LPCVD method. The capacitor insulating film may be formed as an ONO film or NO film. The capacitor electrode 6 was so formed as to have a taper, each, at an upper end.

Then as shown in FIG. 15C, an insulating film 17 was formed on the capacitor electrode 6 by thermal oxidation. The insulating film 17 may be formed by an LPCVD method in place of the thermal oxidation. The insulating film 17 except above the capacitor electrode 6 was etched by a photolithography step with an ammonium fluoride solution. Then a gate insulating film 7 was formed by thermal oxidation and a gate electrode 8 was formed by the LPCVD method with the use of polysilicon, followed by a patterning step.

As shown in FIG. 15D, serving the gate electrode 8 as a mask an ion was implanted into source and drain regions to provide diffusion layers 20. Then an insulating interlayer 4 was formed, a bit line contact hole was formed and a bit line 10 was formed using tungsten silicide, followed by a patterning step. In this way, a memory cell was completed as shown in FIG. 13.

Figure 16:
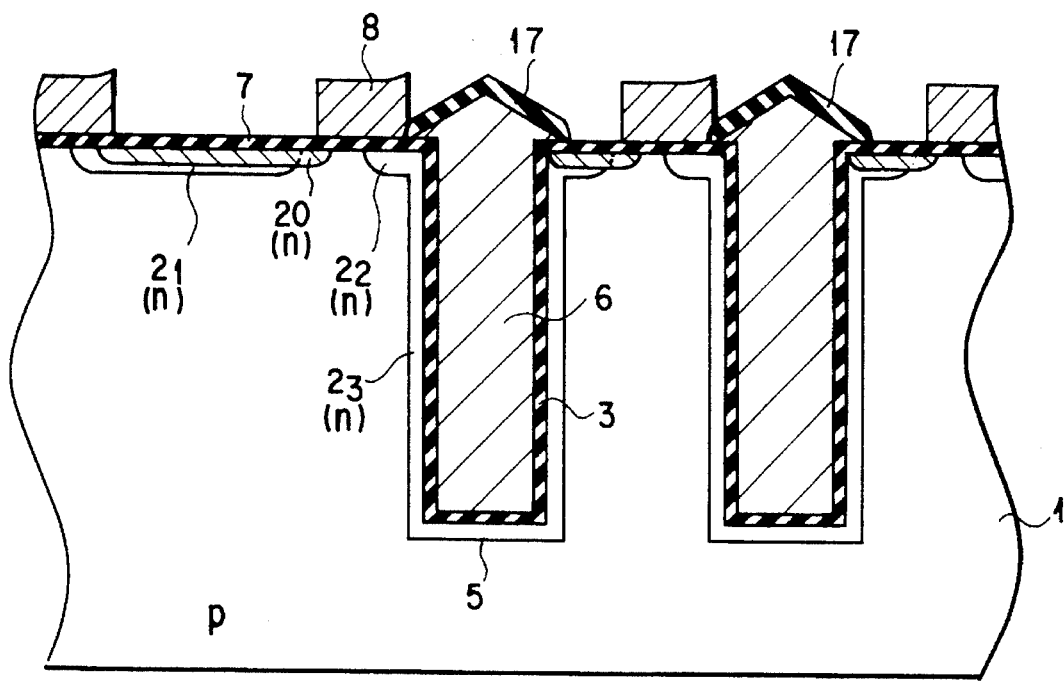
FIG. 16 is a cross-sectional view for explaining a state of source and drain formation created by a misalignment of a gate electrode in the fifth embodiment.

FIG. 16 shows a state in which a misalignment occurs in the formation of a gate electrode. Since, in this case, a gate electrode 6 is so close to a capacitor electrode 6 as to almost ride on the latter electrode, resulting in the failure unable to form a diffusion layer 20 there through ion implantation. Since, however, a diffusion layer $2_2$ has been formed, a resultant transistor encounters no formation of an offset. Even if, in this way, no adequate alignment allowance exists between the gate electrode 8 and the capacitor electrode 6, it is possible to avoid any formation of an offset.

Figure 17:
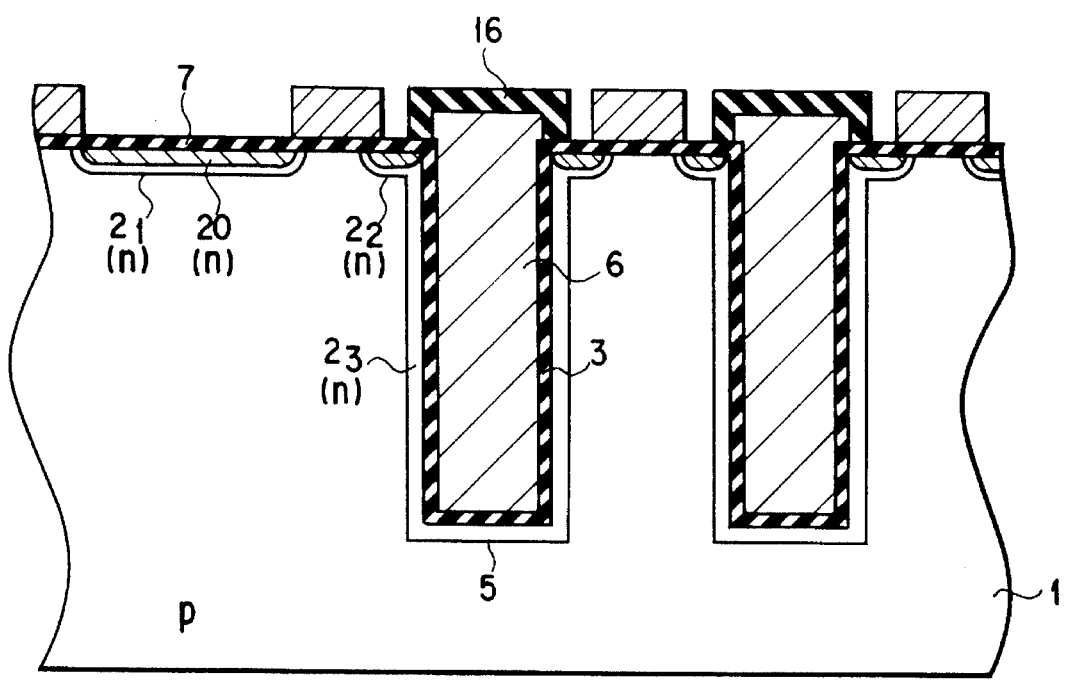
FIG. 17 is a cross-sectional view showing a variant of a capacitor electrode area in the fifth embodiment.

FIG. 17 shows a case where the protruded portion of the capacitor electrode in the present embodiment is formed as to have a vertical side wall in place of a tapered one. In this case, a distance between the capacitor electrode 6 and the gate electrode 8 is narrowed and an ion is not adequately implanted in forming a diffusion layer 20, but no offset configuration is formed because a diffusion layer $2_2$ has been initially formed. In the case where the capacitor electrode 6 is so formed as to have a vertical side wall, if the gate electrode is somewhat thickly formed, both the ends of the gate electrode 8 ride on the capacitor electrode 6, thus failing to perform an ion implantation step in the formation of a diffusion layer 20. Even in this case, however, the gate length of the transistor is determined because the diffusion layers $2_2$ has been formed.

[Sixth Embodiment]

The sixth embodiment-constitutes another form of a DRAM memory cell array exhibiting the same advantage as in the case of the fifth embodiment of the present invention. FIG. 18 is a cross-sectional view corresponding to that of FIG. 13. FIGS. 19A and 19B are cross-sectional views corresponding to FIGS. 14A and 14B. The sixth embodiment is different from the fifth embodiment in the following respects. That is, an n-type diffusion layer 22 is formed in the whole surface portion of an element formation area, a trench 5 and capacitor electrode 6 are formed such that the trench are buried with the capacitor electrode 6, a p-type ion is implanted, in a self-aligned relation, with the capacitor electrode 6 used as a mask to convert an area except for the under portion of the overhang of the capacitor electrode to a p-type layer 23 (indicated by a dotted area). Even if, in the formation of a gate electrode 8, there occurs any slight misalignment, the gate electrode 8 rides on the capacitor electrode 6 or the gate electrode is so formed as to be greater than a predetermined dimension, no offset structure occurs at the gate electrode and the source and drain regions since the under portion of the overhang of the capacitor electrode 6 is of an n-type. The bit line contact portion presents no problem because it becomes an n-type simultaneously with the formation of the source and drain diffusion layers.

A method for manufacturing the sixth embodiment will be explained below with reference to FIG. 20A to 20D.

Figure 20C:
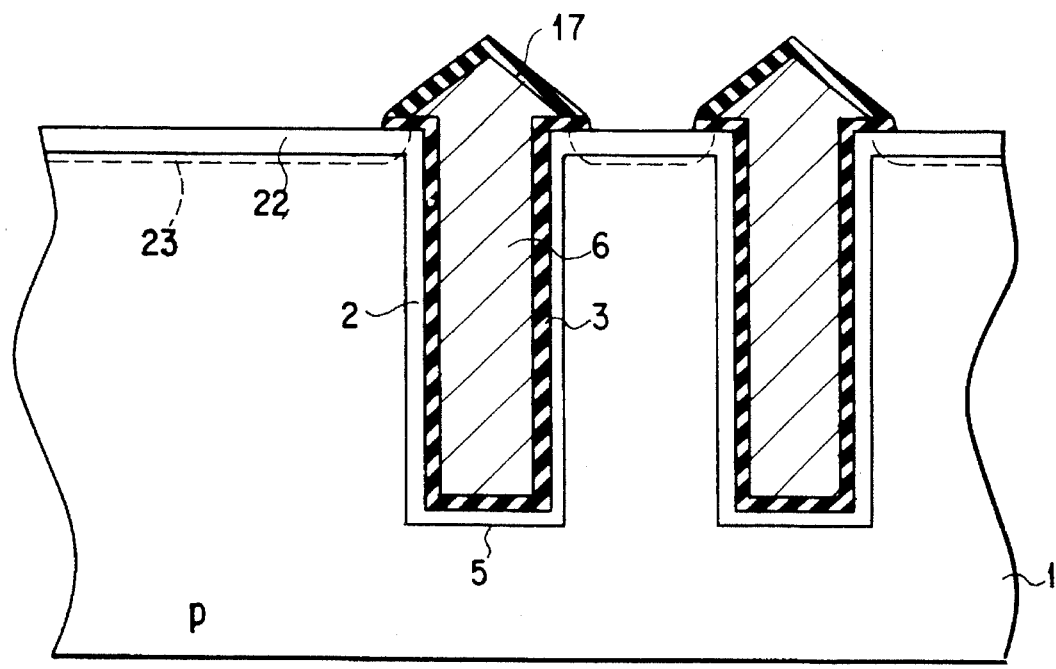
Figure 20D:
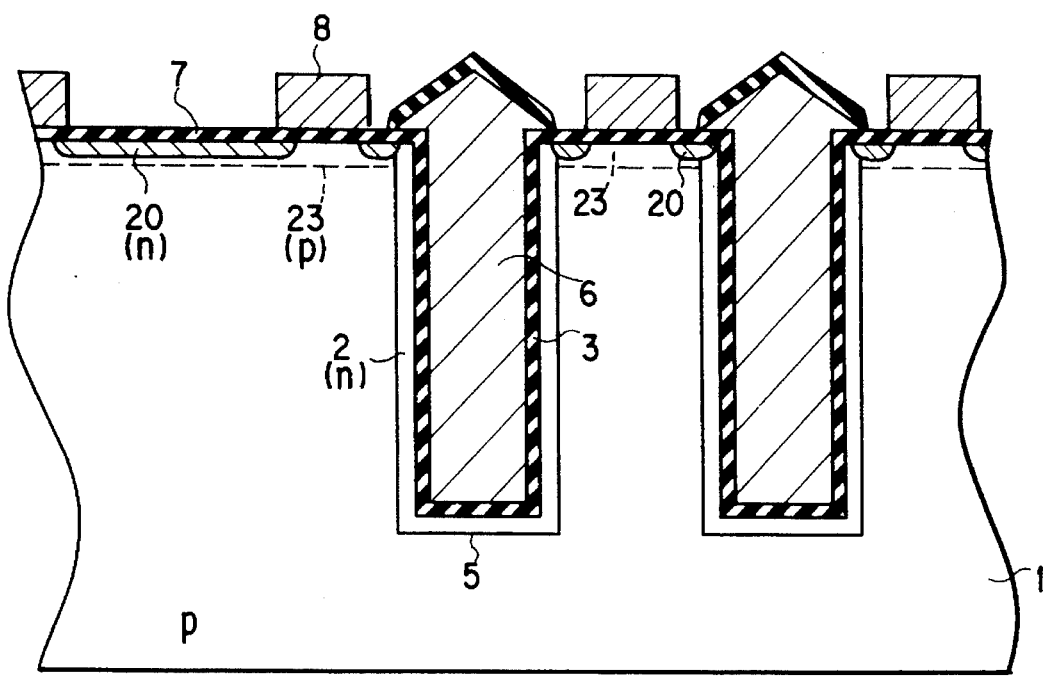

First, as shown in FIG. 20A, an LOCOS oxide film (not shown) was formed in a p-type substrate 1 and an n-type diffusion layer 22 was formed by an ion implantation method in a DRAM cell area, followed by the formation of a trench 5. As shown in FIG. 20B, an n-type diffusion layer 2 was formed in the trench 5 and a capacitor insulating film 3 and an n-type polysilicon for a capacitor electrode 6 were formed relative to the n-type diffusion layer 2. The capacitor electrode 6 was formed by a lithography method to provide a tapered portion on the exposed surface. In order to provide an insulation for a gate 8 to be formed later, an insulating film 17 was formed by a thermal oxidation method on the surface of the capacitor electrode 6. Then with the capacitor electrode 6 used as a mask, a boron ion was implanted into a memory cell formation area to convert its area to a p-type area 23. A gate insulating film 7 and n-type polysilicon layer for the gate electrode 8 were formed as shown in FIG. 20D. Then the gate electrode 8 was processed to provide a word line, followed by forming n-type diffusion layers 20 as source and drain regions by the ion implantation method. In this way a memory cell area was completed.

[Seventh Embodiment]

Figure 21:
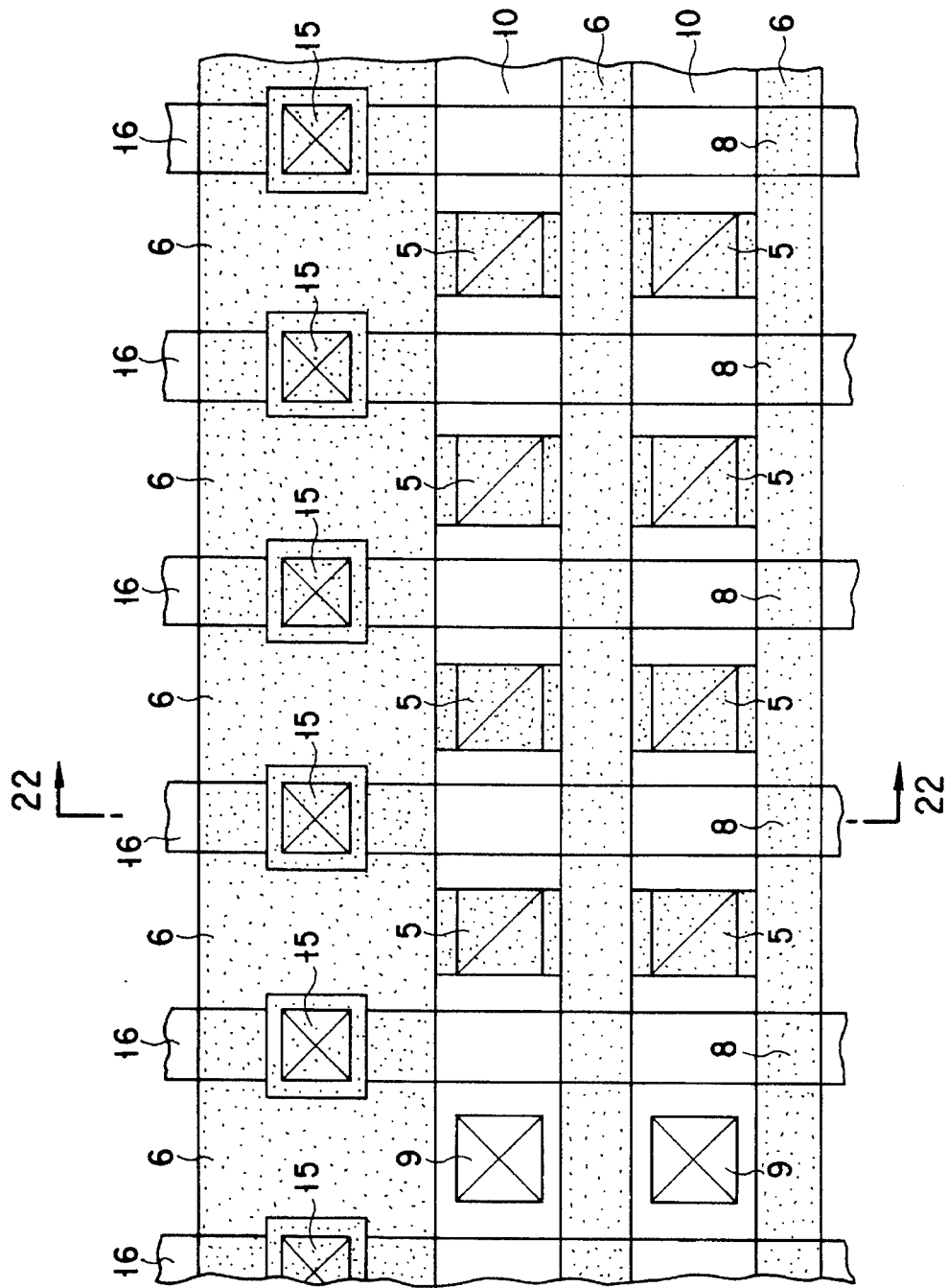
FIG. 21 is a plan view showing a cell array configuration of a DRAM according to a seventh embodiment of the present invention, an explanatory view for explaining a gate electrode connection layer area at the end of the cell array.

FIG. 21 is a plan view showing a plan view showing a gate electrode connection portion of a memory cell array terminal end of a DRAM according to a seventh embodiment of the present invention and FIG. 22 is a cross-sectional view taken along line 22—22 in FIG. 21.

The arrangement of the cell array section is the same as that of the third embodiment as will be set out below and oxide films 12 and 13 are formed on the top and side surfaces of a protruded portion of a capacitor electrode 6. In the seventh embodiment, a contact 15 between a gate electrode 8 and an aluminum connection layer 16 is formed above a capacitor electrode 6 brought out to an outside of the memory cell area.

In the case where the gate electrodes 8 are to be provided above the capacitor electrode 6, if the capacitor electrode 6 is so formed by an RIE (reactive ion etching) method as to have a vertical side surface above the substrate 1, there is a possibility that, when the gate electrode 8 is subsequently formed vertically by the RIE method above the capacitor electrode 6, the gate electrode 8 layer will remain along the edge portion of the capacitor electrode 6 so that short-circuiting occurs between the adjacent gate electrodes 8.

With the present embodiment, the contact 15 is formed above the capacitor electrode 6 brought out to the outside of the memory cell array and, except for the cell array area, the gate electrode 8 and edge of the capacitor electrode 6 will not cross each other, so that the gate electrode 8 is not short-circuited with the adjacent gate electrode 8 or other connection layer. Although, in the cell array portion, the gate electrode 8 and edge portion of the capacitor electrode 6 cross each other at a window area (opening), since only one gate electrode 8 is present at one window area, there is no problem even in the case where the gate electrode 8 layer remains at the edge of the capacitor electrode 6. As a result it is possible to increase a yield in manufacture.

Although, in the seventh embodiment, the capacitor electrode 6 is connected to the silicon substrate 1 with an oxide film 11 interposed therebetween, it may be isolated by a capacitor insulating film 3 instead of interposing the oxide film 11. Isolation may be achieved by a gate insulating film 7 between the gate electrode 8 and the capacitor electrode 6 in place of the oxide film 12 and oxide film 13. Further the aluminum connection layer 16 may be formed of other proper materials, such as poly-Si, Cu, W, $WSi_2$, $MoSi_2$, $TiSi_2$ and Ag.

[Eighth Embodiment]

A cell array arrangement of a DRAM according to an eighth embodiment of the present invention will be explained below with reference to FIGS. 23 to 25A and 25B.

With the eighth embodiment, capacitor electrodes 6 are situated near the surface of a silicon substrate 1 with an oxide film 11 therebetween and provided as a mesh-like pattern having openings only for those MOS transistors. The oxide film 11 is so formed under the capacitor electrode 6 as to have the same pattern as the capacitor electrode 6 except for the corresponding portion to the trench 5. A field plate isolation is achieved by the capacitor electrode 6 as in the case of the second embodiment. A top surface and a side surface of a protruded portion of the capacitor electrode 6 above the surface of the substrate 1 are covered with an insulating film 12 and an insulating film 13.

Figure 24:
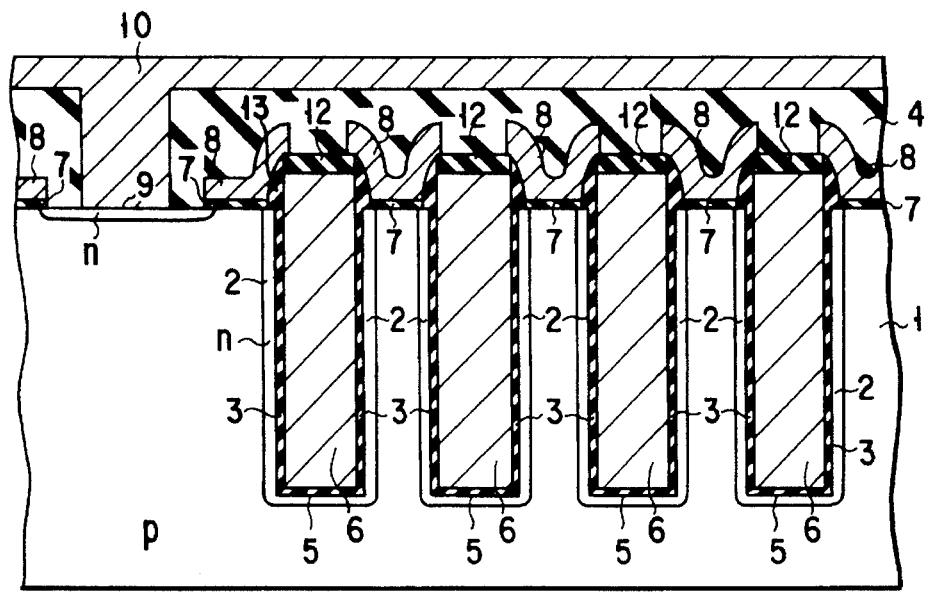
FIG. 24 is a cross-sectional view taken along line 24—24 in FIG. 23.
Figure 25A:
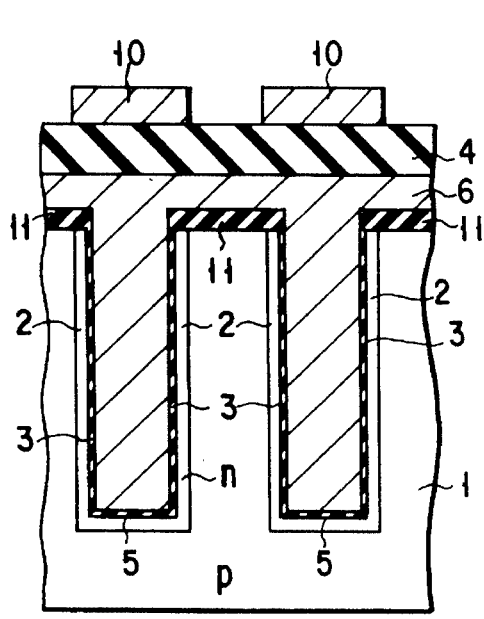
FIGS. 25A and 25B are cross-sectional views taken along lines 25A—25A and 25B—25B, respectively, in FIG. 23.
Figure 25B:
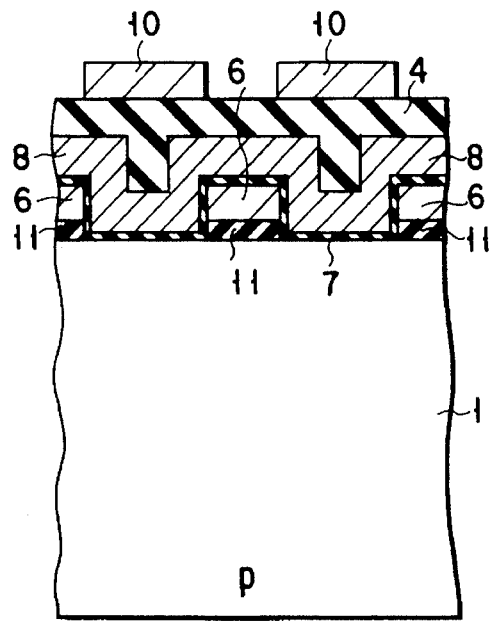

Further, the pattern edge of the gate electrode 8 is so formed as to ride on the insulating film 13 provided on the side surface of the protruded portion of the capacitor electrode 6 or slightly on the insulating film 12 provided on the top surface thereof, because alignment between the gate electrode 8 and the protruded portion of the capacitor electrode 6 is not so severely needed. This is not applied, however, to the pattern edge of the gate electrode 8 adjacent to a bit line contact 9 as shown in FIG. 24. That is, the substrate surface between the adjacent two trenches 5 provides a channel region of each MOS transistor. Diffusion layer 2 of n-type serving as a charge storage layer provides a source or a drain of the MOS transistor.

In the arrangement thus obtained, the same advantage as in the third embodiment is gained. It is also possible to reduce a distance between the trenches 5 in the direction of a bit line 10 and to decrease the area of the memory cell. The gate electrode 8 is patterned above the capacitor electrode 6, thus ensuring the readiness with which the RIE step is carried out. Further, the lithography step can be easily carried out as well, because there is no need for making a margin distance between the opposing edges of the gate electrode 8 and the protruded portion of the capacitor electrode 6 to provide proper alignment.

[Ninth Embodiment]

Figure 26:
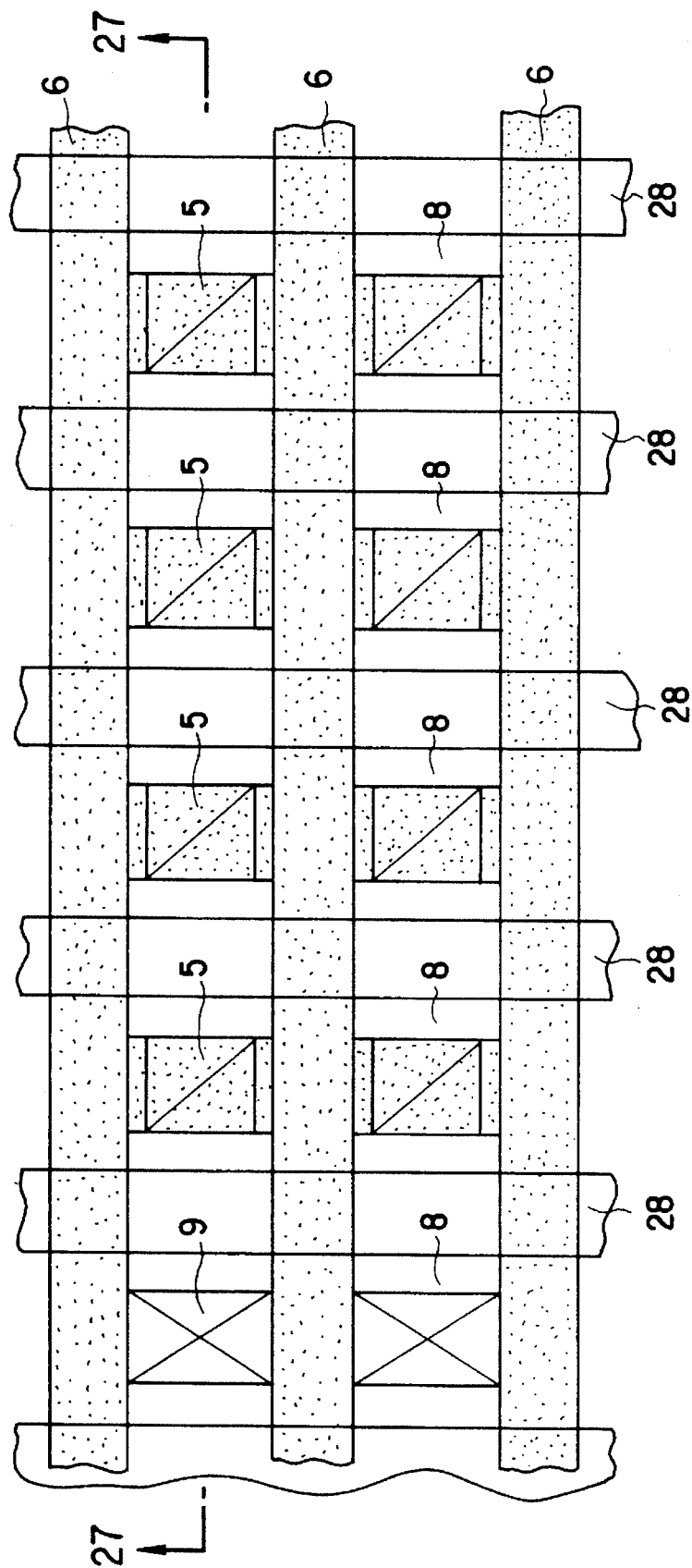
FIG. 26 is a plan view showing a cell array configuration of a DRAM according to a ninth embodiment of the present invention.
Figure 27:
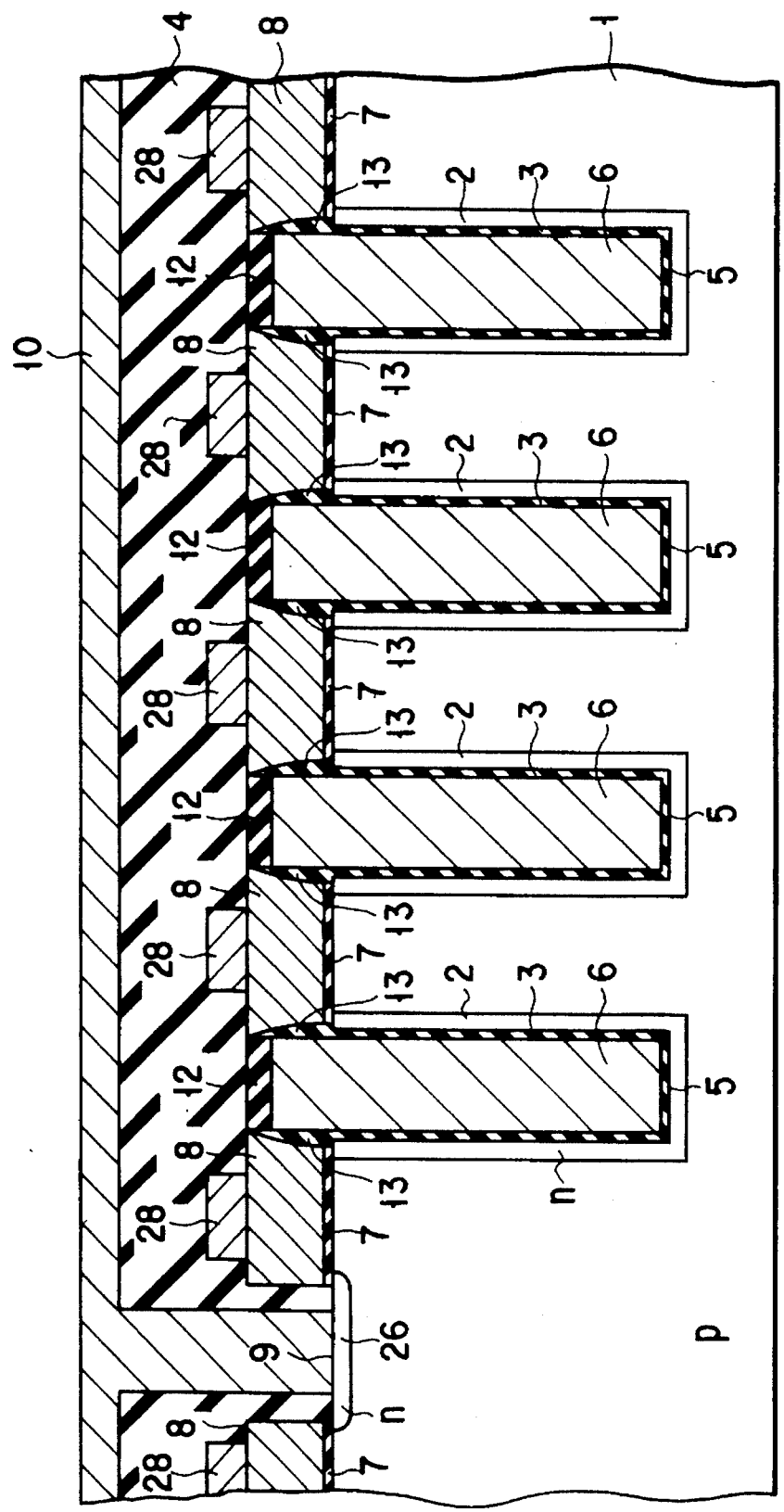
FIG. 27 is a cross-sectional view taken along line 27—27 in FIG. 26.

The cell array configuration of a DRAM according to a ninth embodiment of the present invention will be explained below with reference to FIGS. 26 and 27. The memory cell area in a silicon substrate 1 is defined by a field oxide film (hidden from view) into stripe-like element areas in a direction parallel to a bit line. In the element area a memory cell group (NAND type cells) is formed in such a manner that a plurality of memory cells (four memory cells in the ninth embodiment) are formed in a serial array relative to a bit line 10, each memory cell being comprised of a MOS transistor and a trench capacitor. It is to be noted that the rightmost MOS transistor in FIG. 27 is used to effect separation from an adjacent memory cell, that is, a so-called field shield isolation is achieved.

The trench capacitor is of such a type that four trenches 5 are formed in one NAND type cell array in an element area and that an n-type diffusion layer (charge storage layer) 2 is formed on the inner wall of the trench 5 with a capacitor electrode 6 buried in the trench in which case a capacitor insulating film 3 is provided between the n-type diffusion layer and the capacitor insulating film 3. The capacitor electrodes 6 are so formed that one trench is connected to an adjacent trench in an adjacent memory cell group as shown in FIG. 26.

The MOS transistor is provided between the adjacent trenches 5. Stated in more detail, gate electrodes 8 and 28 are formed above the substrate surface with a gate insulating film 7 interposed therebetween and a source or drain region is comprised of an n-type diffusion layer 2 in the trench 5. The gate electrode is comprised of two layers and the underlying gate electrode 8 is so formed that it provides an inverted pattern of the capacitor electrode 6 and is arranged as an island-like configuration in the MOS transistor area only. Those overlaying gate electrodes 28 are patterned in a continuous way in the direction orthogonal to a bit line to provide a word line.

An n-type diffusion layer 26 of the MOS transistor at one end of the NAND type cell is connected to the bit line 10 via a bit line contact 9. The bit line 10 is patterned in a direction orthogonal to the gate electrode 28. Those capacitor electrodes 6 are formed as a mesh-like pattern having openings for the MOS transistor area only. Insulating films 12 and 13 are formed on the top and side surfaces, respectively, of the protruded portion of the capacitor electrode 6 to separate the capacitor electrode 6 from the gate electrodes 8 and 28.

According to the ninth embodiment thus arranged, the capacitor is formed with a capacitor electrode 6 buried in the trench 5, and it is possible to secure an adequate storage capacity and lower a step on an underlying layer surface. This can ensure the readiness with which an overlying connection layer is formed upon forming a bit line. Further the MOS transistor is formed at the silicon substrate surface and a high-reliable memory cell can be realized which is not affected by a damaged layer caused by an RIE method.

Since the source and drain regions are formed by the n-type diffusion layer 2 formed on the inner wall of the trench 5, it is not necessary to perform a source/drain forming step so that the memory cell manufacturing steps can be reduced. Further, since the effective gate length (effective channel length) is determined by a distance between the n-type diffusion layers 2, there occurs no variation in the effective channel length resulting from any misalignment between the gate electrode 8 and the trench 5 so that the effective channel length can readily be controlled.

The gate electrode 8 and capacitor electrode 6 are situated near each other with the insulating layer 13 interposed therebetween and the gate electrode can be formed by etching back the whole surface of a gate formation layer by RIE method and it is not necessary to perform a lithography step. This raises no problem of alignment between the capacitor electrode 6 and the gate electrode 8, thus ensuring a ready manufacturing step. The gate electrode 28 is isolated by the insulating film 12 from the capacitor electrode 6. For this reason, an isolation withstand voltage between the gate electrode 28 and the capacitor electrode 6 can be realized at as high a voltage as, for example, over 20 V, thus assuring high reliability.

Although the overlying gate electrode 28 is formed by a patterning step using the lithography and RIE methods, since the underlying gate electrode 8 is already present, there is a greater misalignment allowance. Further planarization is achieved by the gate electrode 28 in the memory cell and a ready manufacturing step by the lithography and RIE methods is ensured. Ready application of a polysilicon/silicide gate electrode (for example, poly-Si/WSi$_2$) or polysilicon/metal gate electrode (for example, poly-Si/W) is made because the gate electrode is comprised of a two-layer structure.

The manufacturing steps of the ninth embodiment will be explained below with reference to FIGS. 28A to 28F.

First, an oxide film, for example, was formed as a mask material so as to form trenches at a memory cell area of a silicon substrate as shown in FIG. 28A. The oxide film was etched by the lithography and RIE methods to provide oxide films 24 and trenches 5 were formed by etching in the silicon substrate 1.

As shown in FIG. 28B, an n-type diffusion layer 2 was formed on the inner surface of the trench 5 and then a capacitor insulating film (for example, a silicon nitride/oxide double film structure) 3 was formed on the surface. Thereafter, a plate electrode 6 of, for example, polysilicon was formed in a manner to be buried in the trench 5. An insulating film 12 was formed, using a CVD oxide film for example, on the top surface of the plate electrode 6 and those insulating films 12 and plate electrodes 6 were formed in a mesh-like pattern by the lithography and RIE methods.

As shown in FIG. 28C, after the formation of, for example, a CVD oxide film as an insulating film 13 on the whole surface of a resultant structure, the insulating film 13 was left by the RIE method on the side surface of the capacitor electrode 6. Then a gate insulating film (for example, an oxide film) 7, a gate electrode (for example, polysilicon) and planarized resist 25 were sequentially formed over the resultant structure.

Figure 28D:
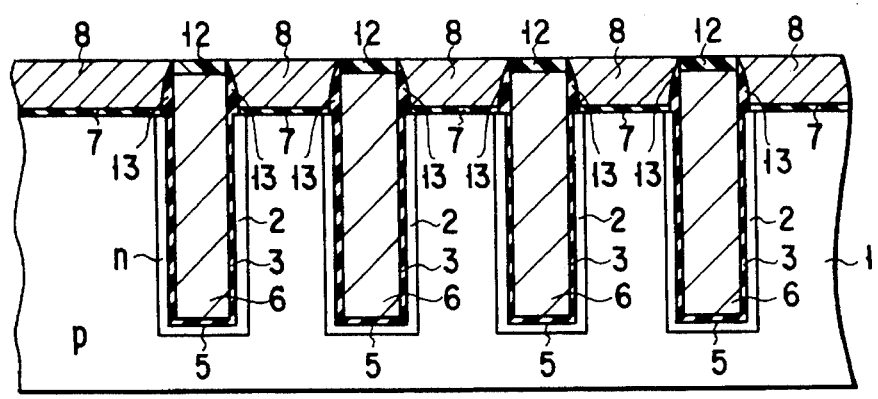
Figure 28E:
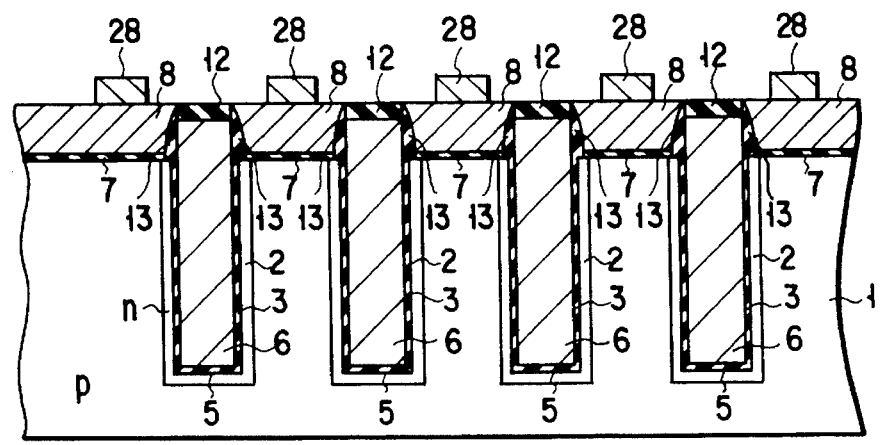

As shown in FIG. 28D, the planarized resist 25 deposited above the plate electrode 6 and a part of gate electrode formation layer 8 were removed by the RIE method to leave a gate electrode 8 so that the gate electrode was formed only on an island-like configuration of an MOS transistor area. Then, as shown in FIG. 28E, a tungsten silicide film, for example, was deposited as an overlying gate electrode 28 on the whole surface of the resultant structure and patterned by the lithography and RIE methods so as to be continuous in one direction of the cell array. By doing so, a word line was provided.

Figure 28F:
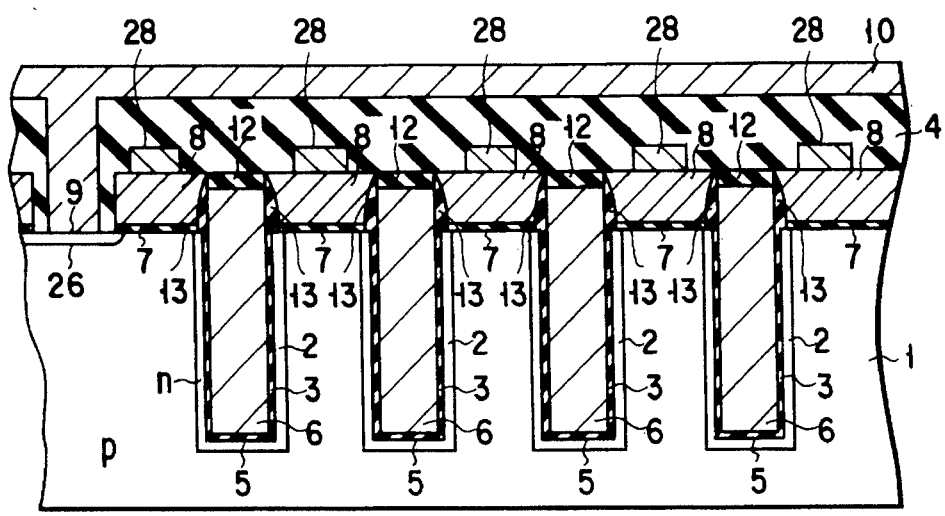

As shown in FIG. 28F, a part of gate electrode 8 corresponding to a bit line contact formation area was removed and an n-type diffusion layer 26 was formed on the surface of the substrate 1. After, for example, a polysilicon/tungsten silicide stacked film was deposited to provide a bit line 10 over the whole surface of the semiconductor structure, it was patterned in a direction orthogonal to the gate electrode 28.

According to the ninth embodiment, although the silicon oxide film 24 was used as the mask for forming the trenches, other proper materials may be used such as silicon nitride, molybdenum silicide, carbon, resist or their composite films. Further, the capacitor insulating film 13 may be formed of a thermal oxide, CVD oxide, CVD nitride, tantalum oxide, hafnium oxide, ferrodielectric, or ordinary dielectric film, or their composite film.

Although the lower electrode of the capacitor is formed of the n-type diffusion layer 2, it may be formed of a metal such as W, Mo, Pt, Ti, Ni, Ta, Al, Co, or C, or silicide, oxide, or nitride of one of these metals. Further, polysilicon and amorphous silicon converted to an n-type may be used. Although polysilicon is used as the capacitor electrode 6, it may be replaced by a metal such as W, Pt, Ti, Ni, Ta, Al, Co, or C, or silicide, oxide or nitride of one of these metals.

Although the insulating films 12 and 13 are formed of a silicon oxide film, a silicon nitride film, etc., may be used instead. The gate electrode 8, being formed of polysilicon, may be formed of a metal such as W, Mo, Ti, Ni, Pt, Ta or Co, or their silicides. The gate electrode 11, being formed of tungsten silicide, may be formed of a metal such as W, Mo, Ti, Ni, Pt, Ta or Co, or their silicide. It may be polysilicon or amorphous silicon.

[Tenth Embodiment]

Figure 29:
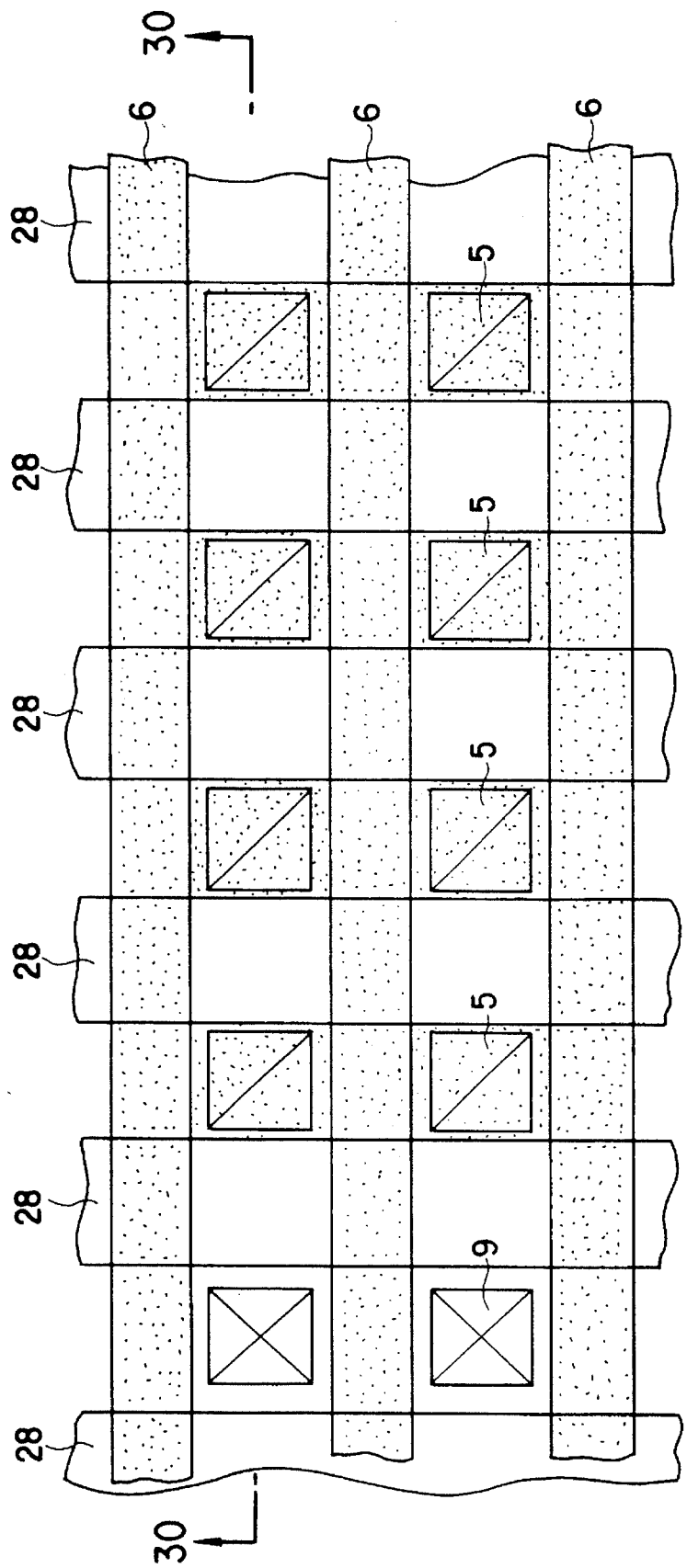
FIG. 29 is a plan view showing a cell array configuration of a DRAM according to a tenth embodiment of the present intention.
Figure 30:
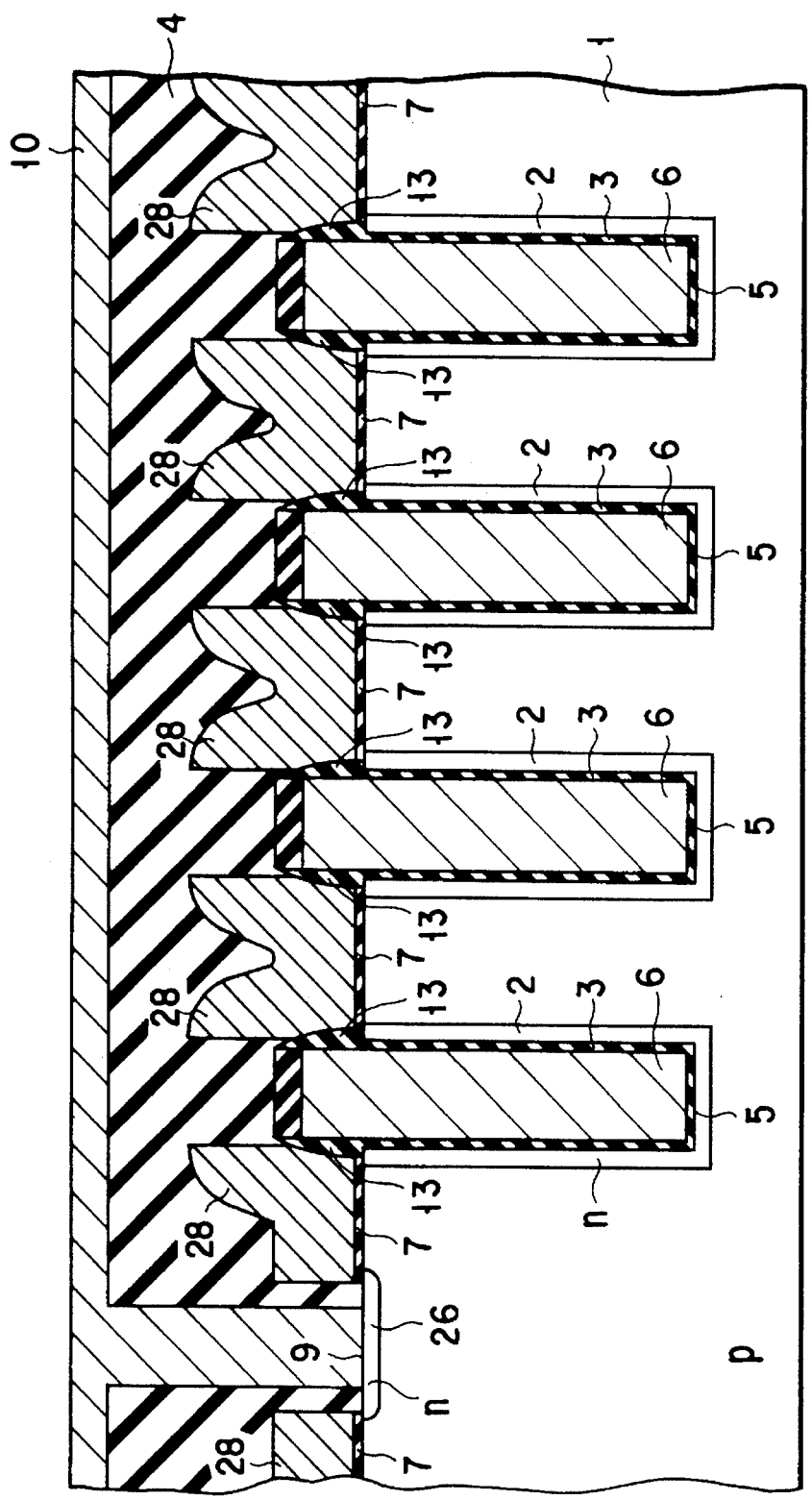
FIG. 30 is a cross-sectional view taken along line 30—30 in FIG. 29.

The cell array configuration of a DRAM according to the tenth embodiment of the present invention will be explained below with reference to FIGS. 29 and 30.

The tenth embodiment is different from the ninth embodiment with respect to their gate electrode configuration. That is, the tenth embodiment includes a gate electrode of a single layer and still maintains the feature of the present invention, in spite of the two-layer electrode being not employed, and ensures a simplified manufacturing step.

Figure 31A:
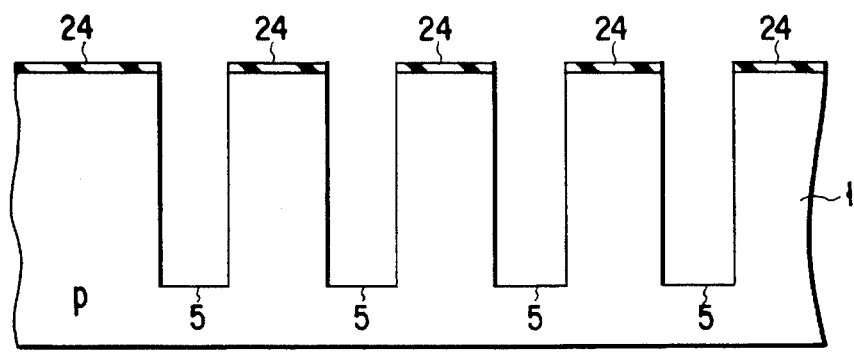
Figure 31B:
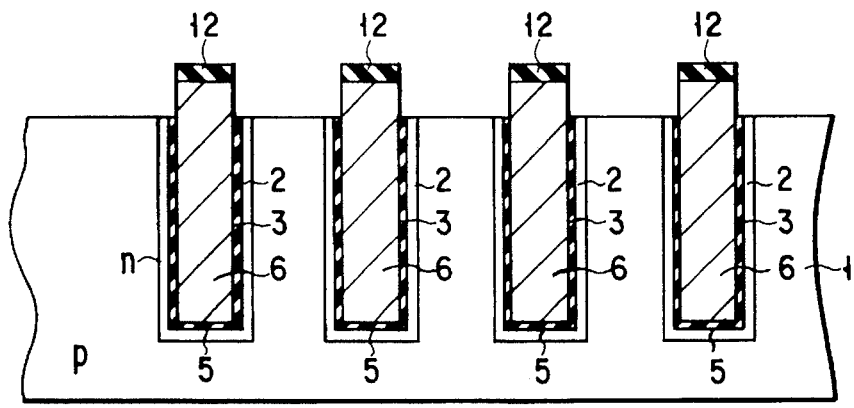
Figure 31C:
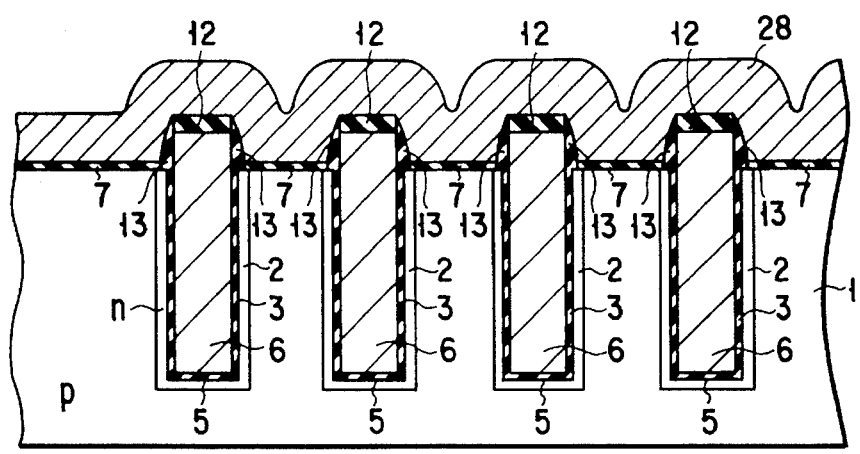
Figure 32:
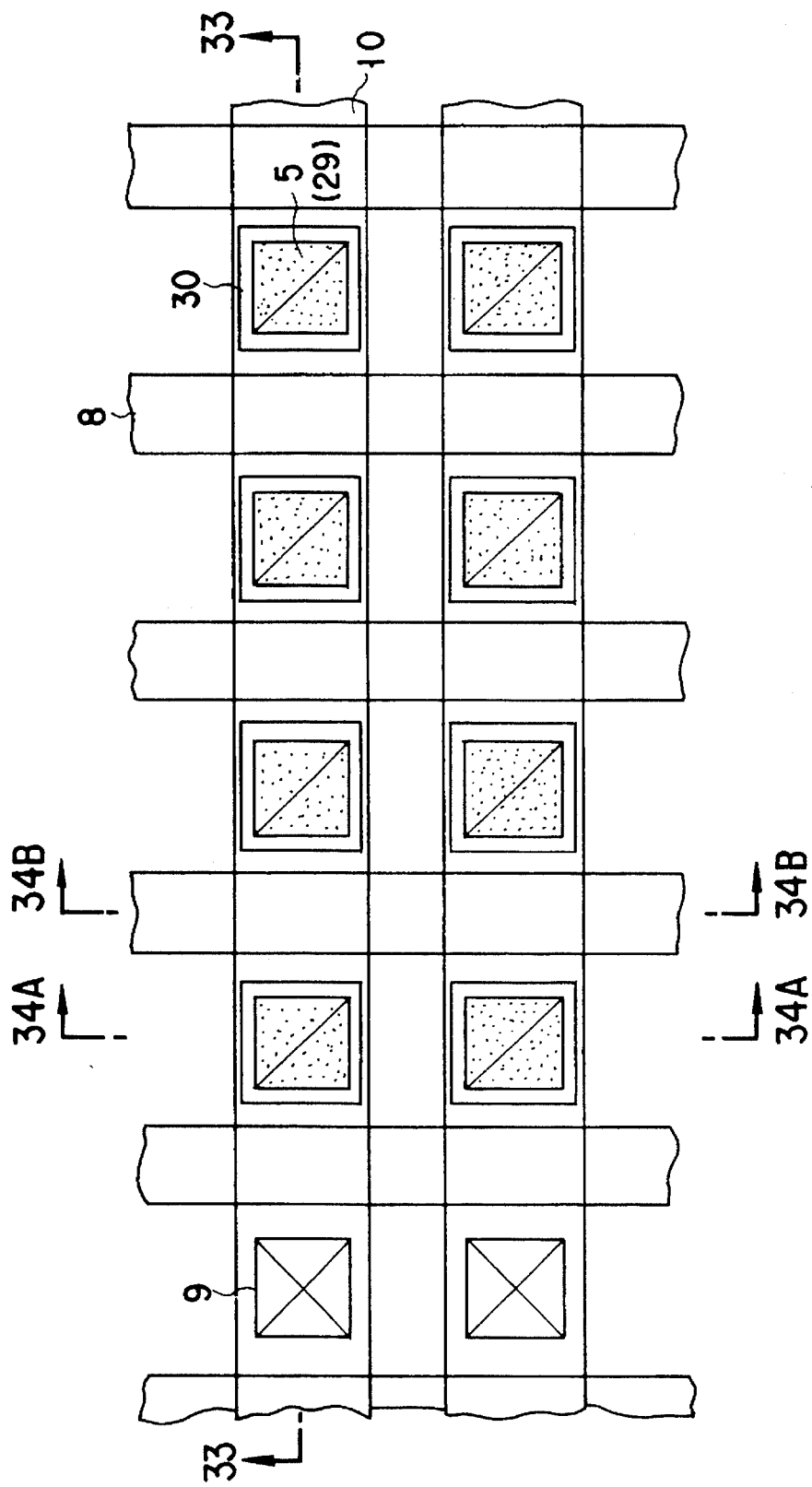
Figure 33:
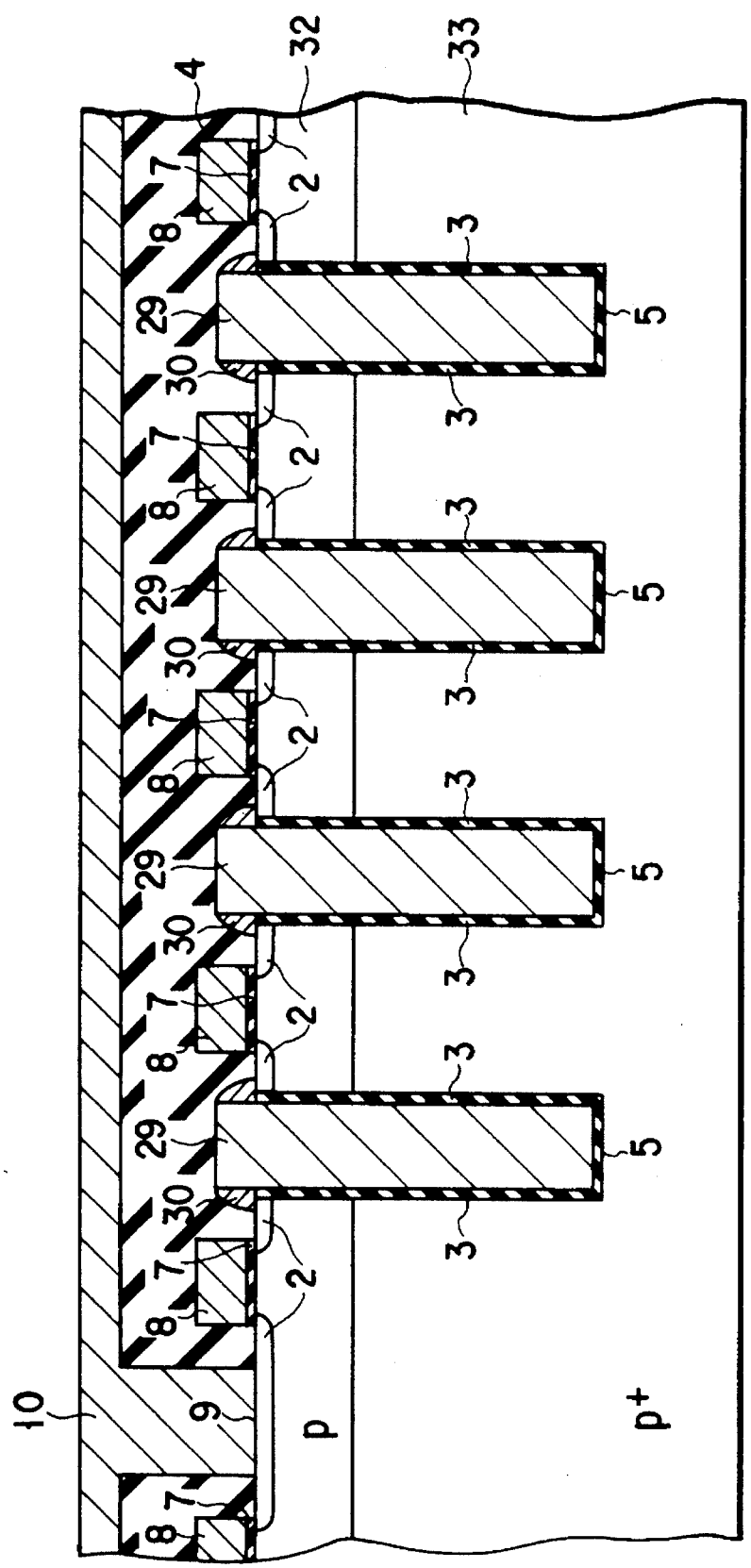
Figure 34A:
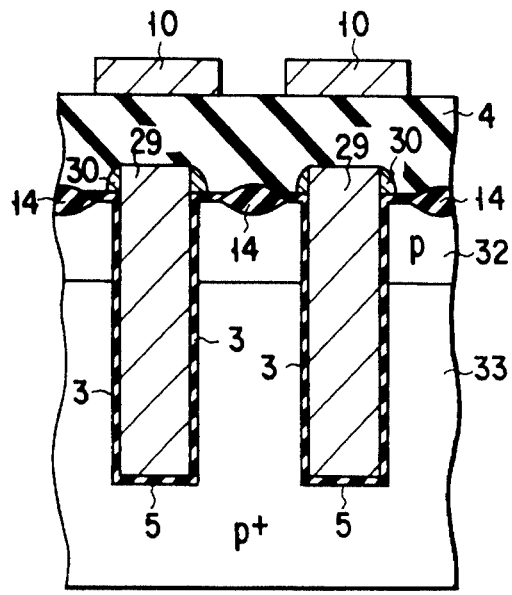
Figure 34B:
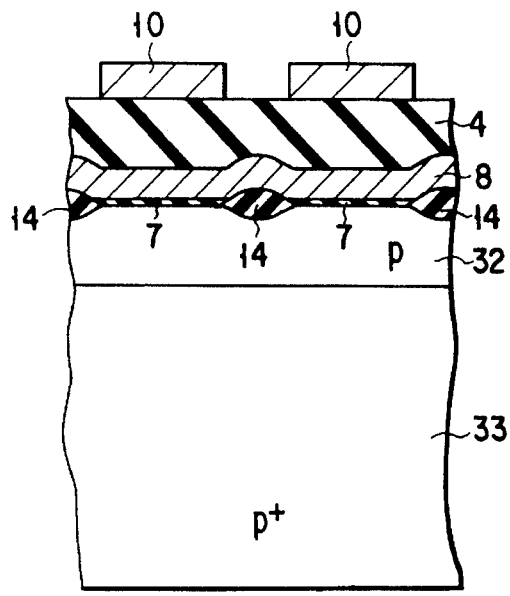

FIGS. 31A to 31E show the method for manufacturing the tenth embodiment. The steps 31A and 31B of the present method are the same as those of the ninth embodiment. subsequently, an insulating film 13 was left on the side surface of a protruded portion of a capacitor electrode 6, followed by the formation of a gate insulating film 7 and gate electrode formation layer 28 as shown in FIG. 31C.

Then, as shown in FIG. 31D, the gate electrode formation layer 28 was formed by the lithography and RIE methods into the resultant semiconductor structure. Then, as shown in FIG. 31E, an insulating interlayer 4 was deposited on the semiconductor structure, followed by the formation of a bit line contact diffusion layer 26. A bit line formation layer was deposited on the whole surface and formed as bit line 10 in a direction orthogonal to the gate electrode 28.

In the tenth embodiment, the edge of the gate electrode 28 is situated on an insulating film 13, so that the effective channel length is determined by a distance between the n-type diffusion layers 2 on the trench side walls. However it is not necessarily required that the edge of the gate electrode 28 be located on the insulating film 13 and it is only necessary that it be within a range not making offset between the n-type diffusion layer 2 and the gate electrode. For example, the edge may be above the diffusion layer 2 or capacitor electrode 6. It may be said that the gate electrode 28 can be formed with a considerably wide allowance.

[Eleventh Embodiment]

A memory cell array of a DRAM according to the eleventh embodiment of the present invention will be explained below with reference to FIGS. 32 to 34A and 34B.

In the eleventh embodiment, a transistor is of such a type that a p-well 32 is formed in a p+ substrate 33 and that, between the adjacent transistors, a trench 5 is so formed as to extend into the p+ substrate 33. A capacitor is constructed by burying a storage electrode 29 in the trench 5 with a capacitor insulating film 3 present therebetween. In this case the substrate 33 acts as a capacitor electrode (plate electrode). An electric charge is stored in the storage electrode 29. The storage electrode 29 is connected to an n type diffusion layer (source or drain region) of the transistor by a conductive layer 30 formed on the side wall of the upper portion of the storage electrode 29.

Figure 35:
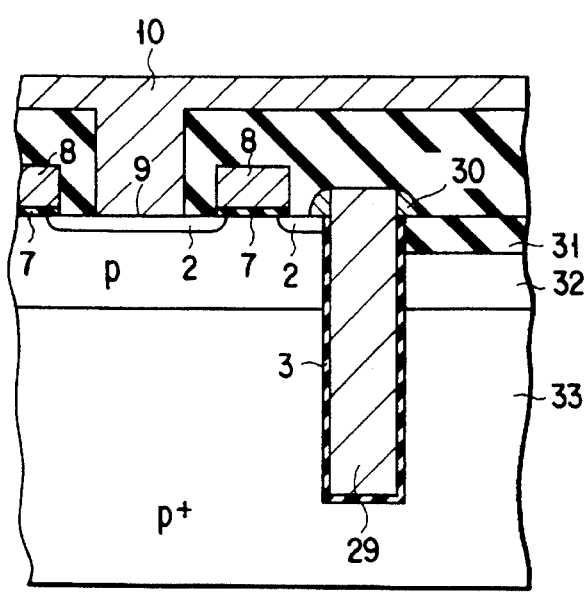
FIG. 35 is a cross-sectional view, taken along a bit line, showing a variant of the eleventh embodiment.

The system for storing the electric charge in the storage electrode 29 can also be applied to other than the NAND configuration having a serial array of the transistors. FIG. 35 is a cross-sectional view, taken along a bit line, showing one form of a memory cell wherein one transistor and one capacitor are combined. A substrate surface portion on the right side of the capacitor is insulated by an insulating film 31.

Even in this embodiment, the capacitor is provided in a trench 5 and it is possible to secure an adequate storage capacity and to lower a step on a layer surface underlying a bit line 10. For this reason, it is possible to readily form an overlying connection layer such as a bit line.

Although the present invention has been explained in conjunction with the respective embodiments, the present invention is not restricted to the aforementioned embodiment and various changes and modifications of the present invention can be made without departing from the spirit and scope of the present invention. Although the n-type diffusion layer is formed in the p-type substrate in the aforementioned embodiment for example, a p-type diffusion layer may be formed in an n-type substrate and an n-type diffusion layer may be formed in a p-well in the surface portion of an n-type substrate.

According to the present invention, as set out above, the MOS capacitor having a capacitor electrode buried in the trench with the capacitor insulating film therebetween is used as an information storage capacitor. By doing so, a NAND cell structure type semiconductor memory device can be provided which can have an adequate storage capacity and lower a step on an underlying layer surface when an overlying connection layer, such as a bit line, is formed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a semiconductor substrate having a memory cell area of a first conductivity type;

a plurality of trenches selectively formed in the memory cell area aligning at certain intervals;

a plurality of memory cell arrays provided in the memory cell area, each of the memory cell arrays comprising a plurality of MOS transistors arranged in a serial array and capacitors connected to the transistors respectively, wherein the capacitors are provided in the trenches respectively, each of the capacitors including:

a charge storage layer of a second conductivity type formed on a inner wall of each of the trenches;

a capacitor insulating film formed on the charge storage layer;

a capacitor electrode formed on the capacitor insulating film so as to bury each of the trenches and extending to a surface of the substrate, the capacitor electrode of the surface being formed except for at least formation areas of the transistors; and the transistors are arranged between adjacent ones of the trenches, each of the transistors including:

a gate electrode provided above the substrate with a gate insulating film formed therebetween;

source and drain regions provided on both sides of the electrode in an aligned direction, the charge storage layer being used as each of the source and drain regions, wherein the capacitor electrode has a protruded portion above the surface of the substrate, having a width not larger than that of the trenches in a direction of the serial array, with a side insulating film formed on a side surface of the protruded portion and left by RIE method, and the gate electrode is provided so as to contact the side surface of the protruded portion of the capacitor electrode formed on each side of the gate electrode with the side insulating film interposed therebetween.

2. The semiconductor memory device according to claim 1, further comprising an insulator being provided under the capacitor electrode at the surface of the substrate.

3. The semiconductor memory device according to claim 2, wherein a thickness of the insulator is same as that of the capacitor insulating film or thicker than that of the capacitor insulating film.

4. The semiconductor memory device according to claim 2, wherein the capacitor electrode acts as a field plate by applying a ground voltage or a negative voltage to the capacitor electrode.

5. The semiconductor memory device according to claim 1, wherein, on a top surface and a side surface of a protruded portion of the capacitor electrode above the surface of the semiconductor substrate, an insulating film is so formed as to be thicker than a gate insulating film of each of the MOS transistors.

6. The semiconductor memory device according to claim 1, wherein a contact to the gate electrode of each of the MOS transistors formed above the capacitor electrode brought out to an outside of the memory cell area.

7. The semiconductor memory device according to claim 1, further comprising a sub gate electrode formed on the gate electrode, the width of the sub gate electrode being smaller than that of the gate electrode.

* * * * *